United States Patent
Nishimori et al.

(10) Patent No.: US 9,437,723 B2
(45) Date of Patent: Sep. 6, 2016

(54) MANUFACTURING METHOD OF SEMICONDUCTOR DEVICE INCLUDING INDIUM

(71) Applicant: FUJITSU LIMITED, Kawasaki-shi, Kanagawa (JP)

(72) Inventors: Masato Nishimori, Atsugi (JP); Toshihide Kikkawa, Machida (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/445,135

(22) Filed: Jul. 29, 2014

(65) Prior Publication Data

US 2015/0041860 A1 Feb. 12, 2015

(30) Foreign Application Priority Data

Aug. 12, 2013 (JP) .................. 2013-167851

(51) Int. Cl.
*H01L 29/778* (2006.01)
*H01L 29/66* (2006.01)
*H01L 29/20* (2006.01)
(Continued)

(52) U.S. Cl.
CPC ......... *H01L 29/778* (2013.01); *H01L 21/2654* (2013.01); *H01L 21/3245* (2013.01); *H01L 29/0843* (2013.01); *H01L 29/2003* (2013.01); *H01L 29/517* (2013.01); *H01L 29/66462* (2013.01); *H01L 29/7786* (2013.01); *H01L 29/41766* (2013.01); *H01L 29/432* (2013.01)

(58) Field of Classification Search
CPC ........... H01L 27/778; H01L 29/66462; H01L 29/2003; H01L 21/2654
See application file for complete search history.

(56) References Cited

U.S. PATENT DOCUMENTS

| 5,043,778 A * | 8/1991 | Teng ................. H01L 21/28525 257/374 |
| 2005/0124176 A1* | 6/2005 | Sugino .............. H01L 29/66318 438/795 |

(Continued)

FOREIGN PATENT DOCUMENTS

| JP | 2002-359256 | 12/2002 |
| JP | 3740744 | 2/2006 |

(Continued)

OTHER PUBLICATIONS

EESR—Partial Search Report dated Jan. 30, 2015 issued with respect to the European Patent Application No. 14178191.4.

(Continued)

*Primary Examiner* — Bilkis Jahan
(74) *Attorney, Agent, or Firm* — Fujitsu Patent Center

(57) ABSTRACT

A semiconductor device includes an electron transit layer configured to be formed on a substrate; an electron supply layer configured to be formed on the electron transit layer; an upper surface layer configured to be formed on the electron supply layer; a gate electrode configured to be formed on the electron supply layer or the upper surface layer; a source electrode and a drain electrode configured to be formed on the upper surface layer; and first conductivity-type regions configured to be formed in the upper surface layer and the electron supply layer immediately below regions where the source electrode and the drain electrode are formed. The electron supply layer is formed of a nitride semiconductor including In. The upper surface layer is formed of a material including a nitride of one or more elements selected among B, Al, and Ga.

2 Claims, 26 Drawing Sheets

(51) Int. Cl.
*H01L 21/265* (2006.01)
*H01L 21/324* (2006.01)
*H01L 29/51* (2006.01)
*H01L 29/08* (2006.01)
*H01L 29/417* (2006.01)
*H01L 29/43* (2006.01)

(56) References Cited

U.S. PATENT DOCUMENTS

| | | | |
|---|---|---|---|
| 2005/0263788 A1* | 12/2005 | Kunii | H01L 29/802 257/192 |
| 2011/0092057 A1* | 4/2011 | Suvorov | H01L 21/0465 438/522 |
| 2013/0105810 A1 | 5/2013 | Nishimori et al. | |
| 2013/0271208 A1* | 10/2013 | Then et al. | 327/541 |

FOREIGN PATENT DOCUMENTS

| | | |
|---|---|---|
| JP | 2007-317794 | 12/2007 |
| JP | 2010-192716 | 9/2010 |

OTHER PUBLICATIONS

Kazuki Nomoto et al; "Reduction of On-Resistance in Ion-Implanted GaN/AlGaN/GaN HEMTs with Low Gate Leakage Current"; Electronics and Communications in Japan, Scripta Technica. New York, US, vol. 93, No. 6, Jun. 2010, pp. 19-24, XP001555361, DOI: 10.1002/ECJ.10213 [retrieved on May 14, 2010] *figure 3* *paragraph "Device Structure"*.

EESR—Extended European Search Report mailed on Jun. 1, 2015 issued with respect to the corresponding European Patent Application No. 14178191.4.

TWOA—Office Action mailed on Oct. 19, 2015 issued with respect to the corresponding Taiwanese Patent Application No. 103125147, with partial English translation.

* cited by examiner

MANUFACTURING METHOD OF SEMICONDUCTOR DEVICE INCLUDING INDIUM

CROSS-REFERENCE TO RELATED APPLICATIONS

This application is based upon and claims the benefit of priority of the prior Japanese Priority Application No. 2013-167851 filed on Aug. 12, 2013, the entire contents of which are hereby incorporated by reference.

FIELD

The disclosures herein generally relate to a semiconductor device and a manufacturing method thereof.

BACKGROUND

Nitride semiconductors such as GaN, AlN, and InN, or mixed crystals of these materials have wide band gaps, and are used as high-output electronic devices, short-wavelength light-emitting devices, and the like. To be used as high-output devices, technologies relating to field-effect transistors (FET), especially, high electron mobility transistors (HEMT) have been developed. A HEMT that uses such a nitride semiconductor is used for a high-output, high-efficiency amplifier, a high-power switching device or the like because it can operate with great current, high voltage, and low on-resistance.

Among such nitride semiconductors, a HEMT having an InAlN/GaN structure that uses InAlN as an electron supply layer has great spontaneous polarization of InAlN, and can generate greater 2 DEG than a HEMT having an AlGaN/GaN structure. Therefore, the HEMT having an InAlN/GaN structure can have the on-resistance lower than the HEMT having an AlGaN/GaN structure, with which characteristics of the semiconductor device can be improved.

RELATED-ART DOCUMENTS

Patent Documents

[Patent Document 1] Japanese Laid-open Patent Publication No. 2002-359256
[Patent Document 2] Japanese Patent No. 3740744

However, when InAlN is used in a semiconductor device, In (Indium) tends to be eliminated if a process such as heating is performed at a high temperature during a manufacturing process. If such elimination of In occurs in a semiconductor device using InAlN, it lowers characteristics of the semiconductor device, and it is not preferable.

Therefore, a semiconductor device and its manufacturing method have been desired for the semiconductor device using InAlN that can be manufactured without lowering the characteristics.

SUMMARY

According to at least an embodiment of the present invention, a semiconductor device includes an electron transit layer configured to be formed on a substrate; an electron supply layer configured to be formed on the electron transit layer; an upper surface layer configured to be formed on the electron supply layer; a gate electrode configured to be formed on the electron supply layer or the upper surface layer; a source electrode and a drain electrode configured to be formed on the upper surface layer; and first conductivity-type regions configured to be formed in the upper surface layer and the electron supply layer immediately below regions where the source electrode and the drain electrode are formed. The electron supply layer is formed of a nitride semiconductor including In. The upper surface layer is formed of a material including a nitride of one or more elements selected among B, Al, and Ga.

The object and advantages of the embodiment will be realized and attained by means of the elements and combinations particularly pointed out in the claims. It is to be understood that both the foregoing general description and the following detailed description are exemplary and explanatory and are not restrictive of the invention as claimed.

DESCRIPTION OF EMBODIMENTS

In the following, embodiments of the present invention will be described with reference to the drawings. Note that the same numerical codes are assigned to the same members, and repetition of their description may be omitted.

First Embodiment

Figure 1:
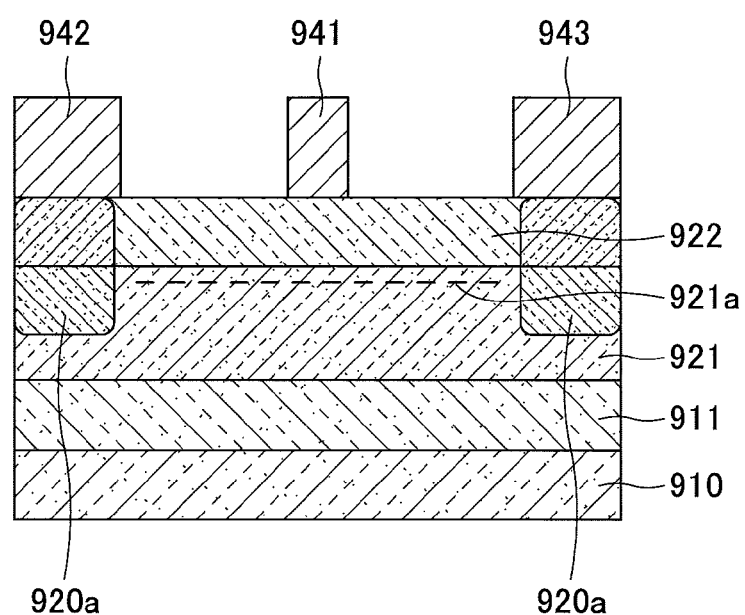
FIG. 1 is a structural view of a semiconductor device whose electron supply layer is formed of InAlN.

First, a HEMT will be described that has a structure using InAlN in its electron supply layer. FIG. 1 is a structural view of a HEMT whose electron supply layer is formed of InAlN. The HEMT having this structure has layers formed on a substrate 910 made of SiC or the like where the layers include a buffer layer 911 formed of AlN and the like, an electron transit layer 921 formed of i-GaN, and an electron supply layer 922 formed of InAlN, which are stacked in this order. With this structure, 2 DEG 921a is generated in the neighborhood of the interface between the electron transit layer 921 and the electron supply layer 922 in the electron transit layer 921. Also, a gate electrode 941, a source electrode 942, and a drain electrode 943 are formed on the electron supply layer 922.

In the HEMT having this structure, InAlN has a wide band gap, which makes the contact resistance become great if the source electrode 942 and the drain electrode 943 are directly formed on InAlN, and it is not preferable. Therefore, there is a method to form n-type regions 920a by ion implantation of an impurity element such as Si in the electron supply layer 922 and the electron transit layer 921 in regions where the source electrode 942 and the drain electrode 943 are formed. This makes it possible to lower the contact resistance between the electron supply layer 922 made of InAlN, and the source electrode 942 and the drain electrode 943, in regions where the n-type regions 920a are formed.

Next, a manufacturing method will be described for the HEMT that has the structure illustrated in FIG. 1, based on FIGS. 2A-3C.

Figure 2A:
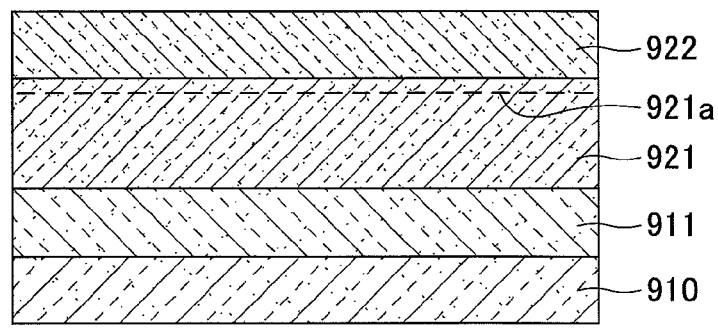
FIGS. 2A-2C are first process views illustrating a manufacturing method of a semiconductor device having a structure illustrated in FIG. 1.

First, as illustrated in FIG. 2A, layers are formed on a substrate 910 made of SiC or the like that include a buffer layer 911, an electron transit layer 921, and an electron supply layer 922. Note that the buffer layer 911, the electron transit layer 921, and the electron supply layer 922 are formed by epitaxial growth using MOCVD (Metal Organic Chemical Vapor Deposition). The buffer layer 911 is formed of a material including AlN and the like, and the electron transit layer 921 is formed of GaN, both at a substrate temperature of about 1000° C. The electron supply layer 922 is formed of InAlN, for example, $In_{0.17}Al_{0.83}N$ at a substrate temperature of about 500 to 800° C.

Figure 2B:
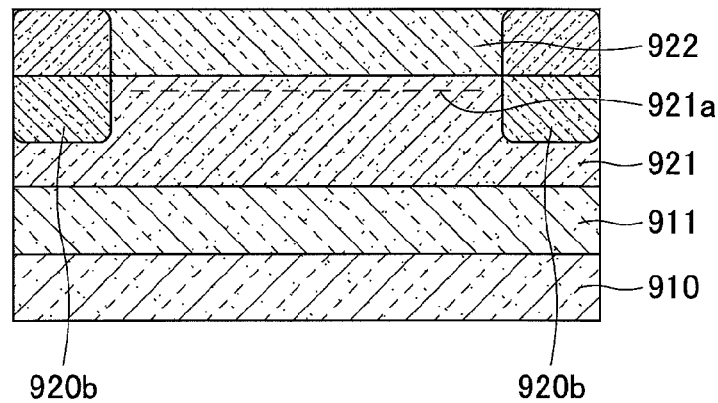

Next, as illustrated in FIG. 2B, ion implantation is applied with an impurity element such as Si to regions 920b where n-type regions 920a are to be formed in the electron supply layer 922 and the electron transit layer 921 immediately below regions where a source electrode 942 and a drain electrode 943 are to be formed. Specifically, ion implantation is applied to the regions 920b where the n-type regions 920a are to be formed in the electron supply layer 922 and the electron transit layer 921, with the impurity element such as Si to have the density of about $1\times10^{20}/cm^3$.

Figure 2C:
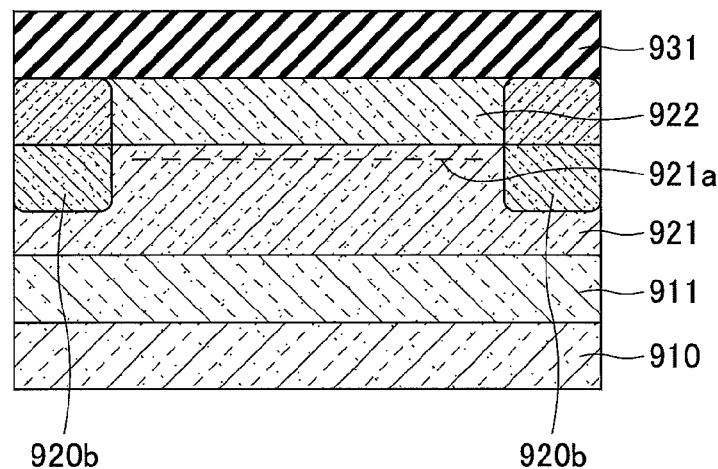

Next, as illustrated in FIG. 2C, a heat-protective film 931 is formed of SiN with the thickness of about 200 nm on the electron supply layer 922. The heat-protective film 931 is formed by CVD (Chemical Vapor Deposition), and has an amorphous state. Note that the heat-protective film 931 functions as a protective film when Si-activation annealing is performed later. If activation annealing is performed without forming such a heat-protective film 931, the surface of the electron supply layer 922 formed of IaAlN becomes rough, which lowers the characteristics of the semiconductor device.

Figure 3A:
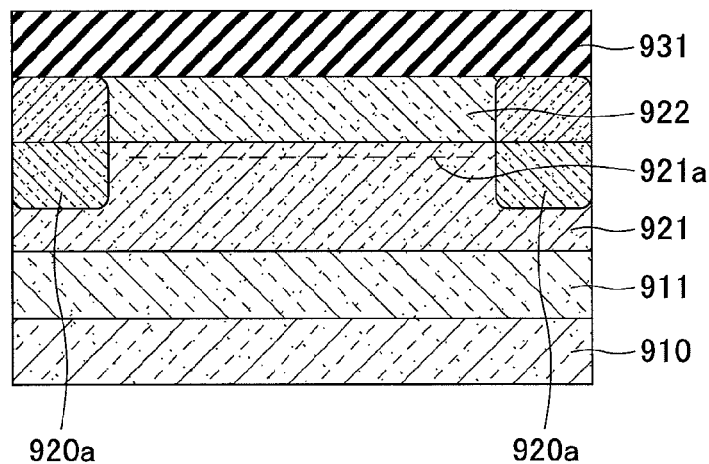
FIGS. 3A-3C are second process views illustrating the manufacturing method of the semiconductor device having the structure illustrated in FIG. 1.

Next, as illustrated in FIG. 3A, Si-activation annealing is performed. Specifically, RTA (Rapid Thermal Annealing) is performed to heat it for one minute at a temperature about 1100° C. This activates Si doped in the regions 920b, and the regions 920b become the n-type regions 920a. Note that it is preferable to perform Si-activation annealing at a temperature greater than or equal to 900° C. and less than or equal to 1500° C. because Si is not activated at a temperature less than 900° C.

Figure 3B:
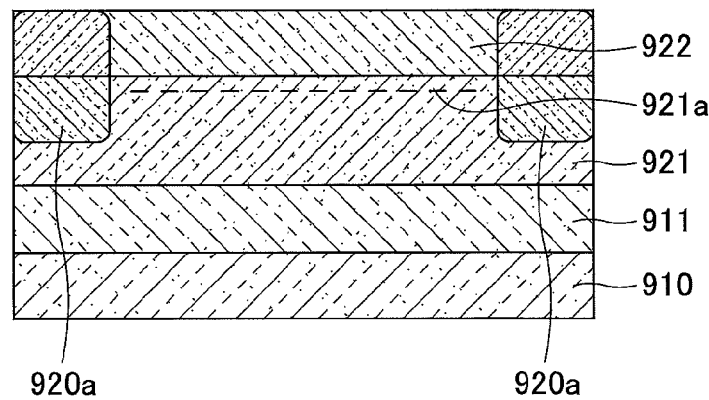

Next, as illustrated in FIG. 3B, the heat-protective film 931 is removed by using a solvent that includes hydrofluoric acid.

Figure 3C:
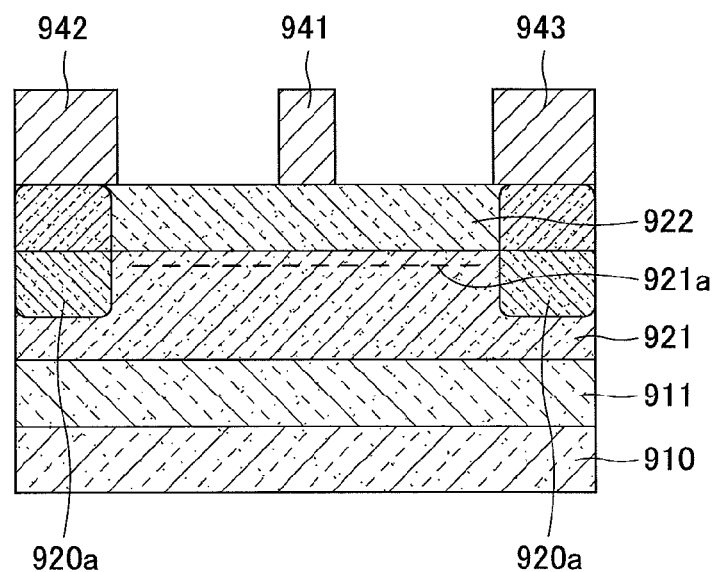

Next, as illustrated in FIG. 3C, a gate electrode 941, the source electrode 942, and the drain electrode 943 are formed on the electron supply layer 922. Note that the source electrode 942 and the drain electrode 943 are formed on the n-type regions 920a in the electron supply layer 922. Thus, the HEMT having the structure illustrated in FIG. 1 can be manufactured.

In a HEMT manufactured by such a manufacturing method, In is eliminated that has been included in the electron supply layer 922 during the Si-activation annealing illustrated in FIG. 3A, and In penetrates into the inside of the heat-protective film 931 formed of SiN. This results in defect of In in the electron supply layer 922. If such defect of In occurs in the electron supply layer 922, the generated 2 DEG 921a is reduced, and the on-resistance becomes high.

(Semiconductor Device)

Figure 4:
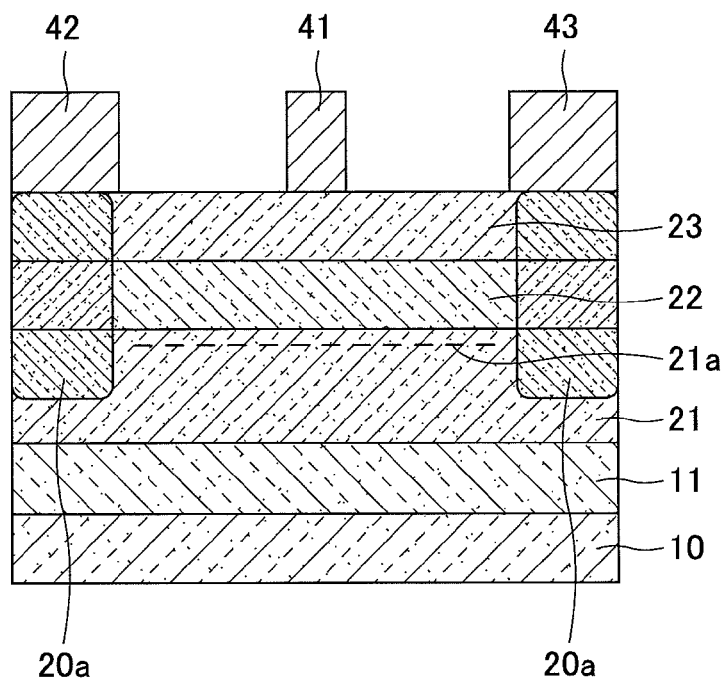
FIG. 4 is a structural view of a semiconductor device according to a first embodiment.

Next, a semiconductor device will be described according to an embodiment of the present invention based on FIG. 4. The semiconductor device in the present embodiment has layers formed on a substrate 10 made of SiC or the like where the layers include a buffer layer 11 formed of AlN and the like, an electron transit layer 21 formed of i-GaN, an electron supply layer 22 formed of InAlN, and an upper surface layer 23 formed of AlGaN, which are stacked in this order. With this structure, 2 DEG 21a is generated in the neighborhood of the interface between the electron transit layer 21 and the electron supply layer 22 in the electron transit layer 21.

The substrate 10 may be formed of a material other than SiC such as Si. Also, the electron transit layer 21 is formed to have the thickness of about 2 μm, the electron supply layer 22 is formed of $In_{0.17}Al_{0.83}N$ having the thickness of about 10 nm, and the upper surface layer 23 is formed of $Al_{0.2}Ga_{0.8}N$ having the thickness of about 10 nm.

A gate electrode 41, a source electrode 42, and a drain electrode 43 are formed on the upper surface layer 23. Also, n-type regions 20a are formed by applying ion implantation with an impurity element such as Si to the upper surface layer 23, the electron supply layer 22, and the electron transit layer 21 in regions where the source electrode 42 and the drain electrode 43 are formed. This makes it possible to lower the contact resistance between the upper surface layer 23, and the source electrode 42 and the drain electrode 43 in the regions where the n-type regions 20a are formed.

In the present embodiment, the electron transit layer 21 is formed of a nitride semiconductor including In, which is InAlN, or may be formed of InGaN or InAlGaN. Also, the structure may be modified to have an intermediate layer made of AlN formed between the electron transit layer 21 and the electron supply layer 22. The electron supply layer 22 may be formed of InAlGaN. In InAlN or the like, elimination of In is confirmed at a substrate temperature over 800° C. Therefore, it is preferable to set the substrate temperature greater than or equal to 500° C. and less than or equal to 800° C. when forming the electron supply layer 22 of InAlN or the like.

Also, the upper surface layer 23 may be formed as a layer not including In in a nitride semiconductor. For example, it may be formed of a nitride of one or more elements selected among B, Al, Ga, which includes GaN, AlN, and BGaN. Also, in the present embodiment, the upper surface layer 23 is formed as a film at substantially the same substrate temperature as that for forming the electron supply layer 22.

(Manufacturing Method of Semiconductor Device)

Next, a manufacturing method of the semiconductor device in the present embodiment will be described based on FIGS. 5A-6C.

Figure 5A:
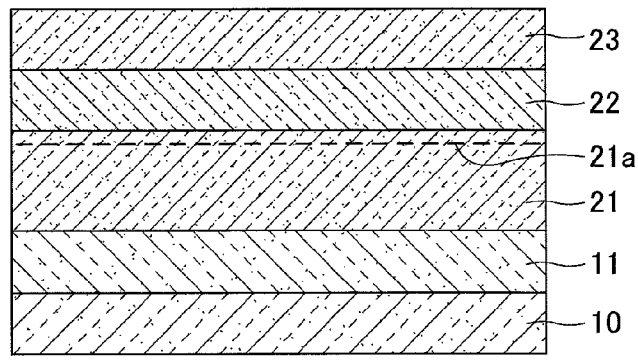
FIGS. 5A-5C are first process views illustrating a manufacturing method of the semiconductor device according to the first embodiment.

First, as illustrated in FIG. 5A, layers are formed on a substrate 10 made of SiC or the like that include a buffer layer 11, an electron transit layer 21, an electron supply layer 22, and an upper surface layer 23 by epitaxial growth using MOCVD. The buffer layer 11 is formed of a material including AlN and the like, and the electron transit layer 21 is formed of GaN, both at a substrate temperature of about 1000° C. The electron supply layer 22 is formed of InAlN, for example, $In_{0.17}Al_{0.83}N$ at a substrate temperature of about 500 to 800° C. The upper surface layer 23 is formed of AlGaN, for example, Al0.2Ga0.8N at a substrate temperature of about 800° C.

Figure 5B:
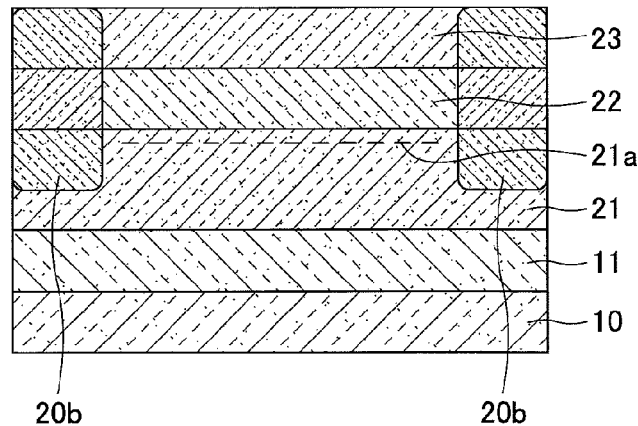

Next, as illustrated in FIG. 5B, ion implantation is applied with an impurity element such as Si to the upper surface layer 23, the electron supply layer 22, and the electron transit layer 21 in regions 20b located immediately below regions where a source electrode 42 and a drain electrode 43 are to be formed, and the regions 20b are to be formed as n-type regions 20a. Specifically, ion implantation is applied to the regions 20b where the n-type regions 20a are to be formed in the upper surface layer 23, the electron supply layer 22, and the electron transit layer 21, with the impurity element such as Si to have the density of about $1 \times 10^{20}/cm^3$. For example, when performing Si ion implantation, Si ions are implanted at an acceleration voltage of 40 keV and a dose of $1 \times 10^{15}/cm^2$.

Figure 5C:
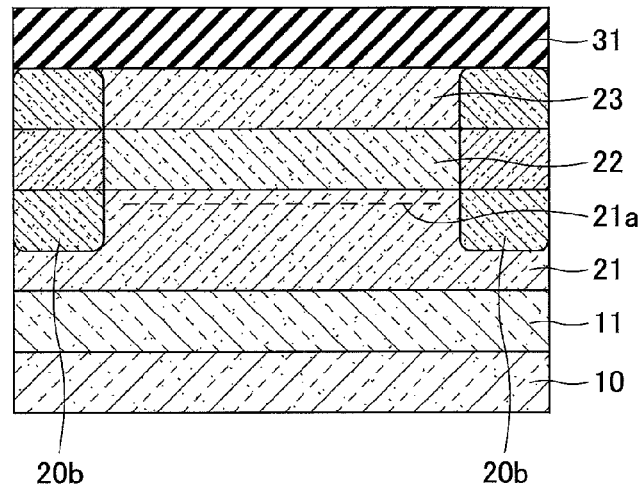

Next, as illustrated in FIG. 5C, a heat-protective film 31 is formed of SiN with the thickness of about 200 nm on the upper surface layer 23. The heat-protective film 31 is formed by CVD (Chemical Vapor Deposition), and has an amorphous state.

Figure 6A:
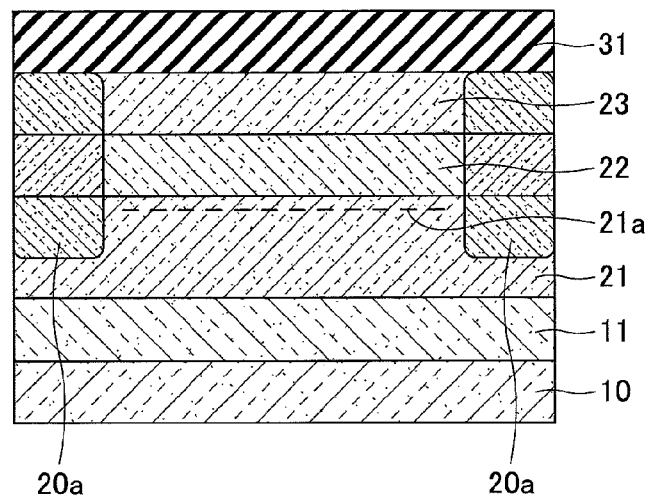
FIGS. 6A-6C are second process views illustrating the manufacturing method of the semiconductor device according to the first embodiment.

Next, as illustrated in FIG. 6A, Si-activation annealing is performed. Specifically, RTA is performed to heat it for one minute at a temperature about 1100° C. This activates Si doped in the regions 20b, and the regions 20b become the n-type regions 20a.

Figure 6B:
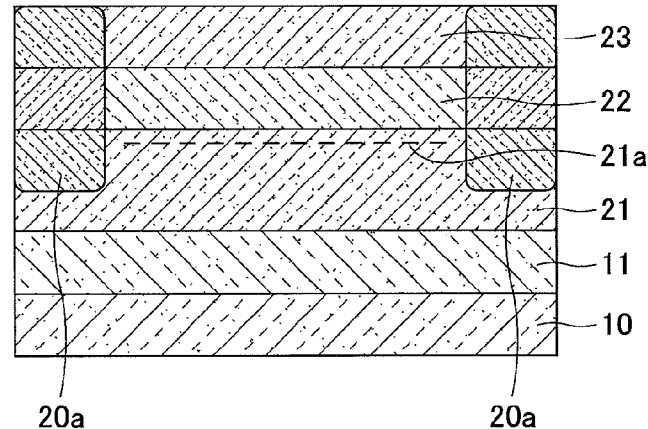

Next, as illustrated in FIG. 6B, the heat-protective film 31 is removed by using a solvent that includes hydrofluoric acid.

Figure 6C:
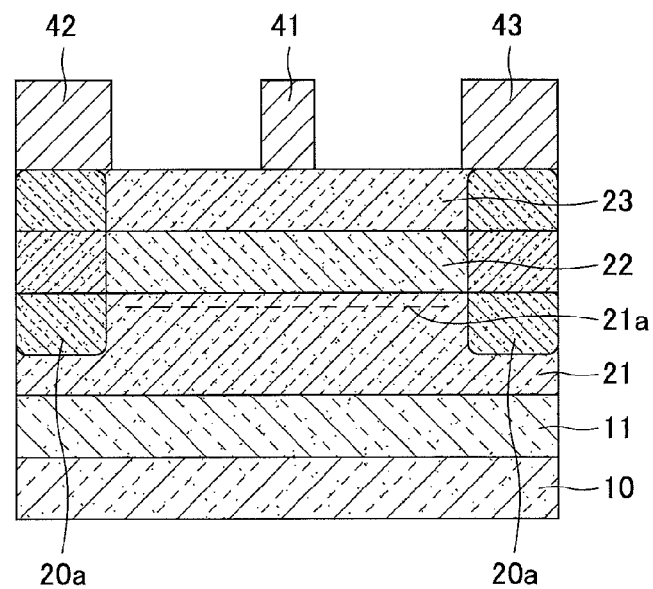

Next, as illustrated in FIG. 6C, a gate electrode 41, the source electrode 42, and the drain electrode 43 are formed on the upper surface layer 23. Note that the source electrode 42 and the drain electrode 43 are formed on the n-type regions 20a in the upper surface layer 23. Thus, the semiconductor device can be manufactured according to the present embodiment.

In the present embodiment, the upper surface layer 23 is formed as a crystal film of AlGaN formed by epitaxial growth on the electron supply layer 22 formed of InAlN. A finding is obtained that elimination of In in the electron supply layer 22 is suppressed by forming such a crystal film of AlGaN on InAlN even if it is heated at a high temperature such as 1100° C. Therefore, in the present embodiment, the Si-doped regions 20b can become the n-type regions 20a without causing defect of In in the electron supply layer 22. Therefore, in the present embodiment, the on-resistance does not become great because the 2 DEG 21a is not reduced, and the contact resistance can be lowered at the source electrode 42 and the drain electrode 43.

Second Embodiment

Next, a second embodiment will be described.

(Semiconductor Device)

Figure 7:
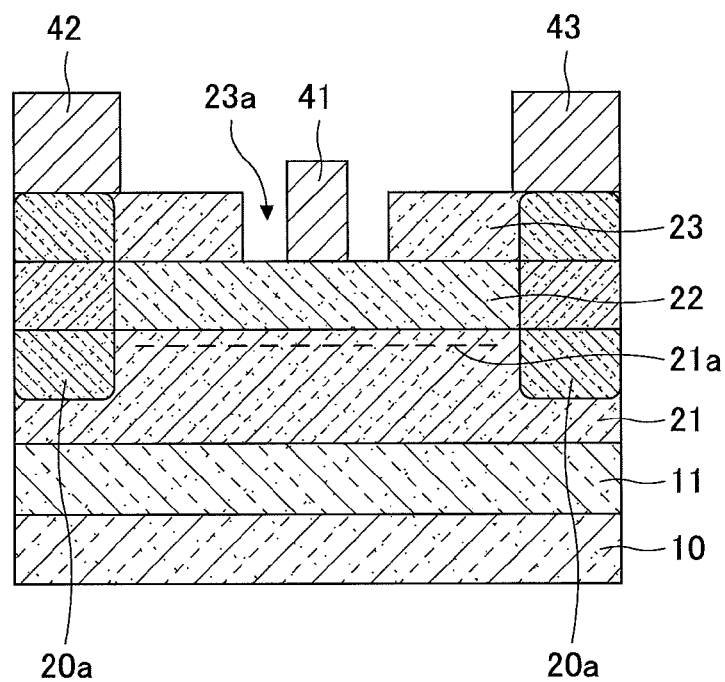
FIG. 7 is a structural view of a semiconductor device according to a second embodiment.

Next, a semiconductor device will be described according to the present invention based on FIG. 7. The semiconductor device in the present embodiment has layers formed on a substrate 10 made of SiC or the like where the layers include a buffer layer 11 formed of AlN and the like, an electron transit layer 21 formed of i-GaN, an electron supply layer 22 formed of InAlN, and an upper surface layer 23 formed of AlGaN, which are stacked in this order. With this structure, 2 DEG 21a is generated in the neighborhood of the interface between the electron transit layer 21 and the electron supply layer 22 in the electron transit layer 21.

The substrate 10 may be formed of a material other than SiC such as Si. Also, the electron transit layer 21 is formed to have the thickness of about 2 μm, the electron supply layer 22 is formed of $In_{0.17}Al_{0.83}N$ having the thickness of about nm, and the upper surface layer 23 is formed of $Al_{0.2}Ga_{0.8}N$ having the thickness of about 10 nm.

A source electrode 42 and a drain electrode are formed on the upper surface layer 23. An opening 23a is formed in a region where a gate electrode 41 is formed, by removing a part of the upper surface layer 23, and the gate electrode 41 is formed on the electron supply layer 22 at the opening 23a in the upper surface layer 23. This shortens the distance between the gate electrode 41 and the 2 DEG 21a, with which a high-frequency characteristic can be improved. Also, n-type regions 20a are formed by applying ion implantation with an impurity element such as Si to the upper surface layer 23, the electron supply layer 22, and the electron transit layer 21 in regions where the source electrode 42 and the drain electrode 43 are formed. This makes it possible to lower the contact resistance between the upper surface layer 23, and the source electrode 42 and the drain electrode 43 in the regions where the n-type regions 20a are formed.

(Manufacturing Method of Semiconductor Device)

Next, a manufacturing method of the semiconductor device in the present embodiment will be described based on FIGS. 8A-10B.

Figure 8A:
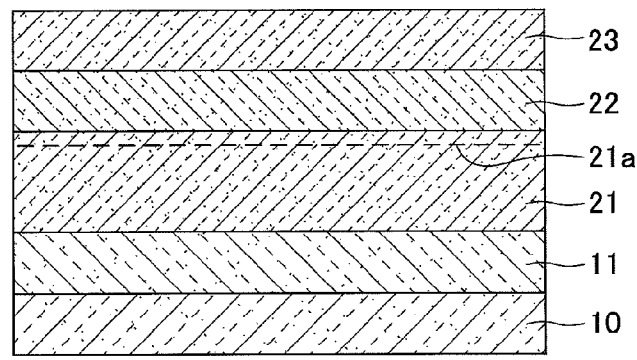
FIGS. 8A-8C are first process views illustrating a manufacturing method of the semiconductor device according to the second embodiment.

First, as illustrated in FIG. 8A, layers are formed on a substrate 10 made of SiC or the like that include a buffer layer 11, an electron transit layer 21, an electron supply layer 22, and an upper surface layer 23 by epitaxial growth using MOCVD. The buffer layer 11 is formed of a material including AlN and the like, and the electron transit layer 21 is formed of GaN, both at a substrate temperature of about 1000° C. The electron supply layer 22 is formed of InAlN, for example, $In_{0.17}Al_{0.83}N$ at a substrate temperature of about 500 to 800° C. The upper surface layer 23 is formed of AlGaN, for example, Al0.2Ga0.8N at a substrate temperature of about 800° C.

Figure 8B:
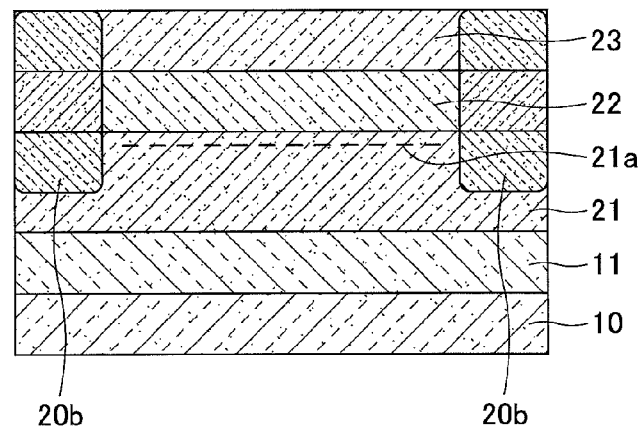

Next, as illustrated in FIG. 8B, ion implantation is applied with an impurity element such as Si to the upper surface layer 23, the electron supply layer 22, and the electron transit layer 21 in regions 20b located immediately below regions where a source electrode 42 and a drain electrode 43 are to be formed, and the regions 20b are to be formed as n-type regions 20a. Specifically, ion implantation is applied to the regions 20b where the n-type regions 20a are to be formed in the upper surface layer 23, the electron supply layer 22, and the electron transit layer 21, with the impurity element such as Si to have the density of about $1 \times 10^{20}/cm^3$. For example, when performing Si ion implantation, Si ions are implanted at an acceleration voltage of 40 keV and a dose of $1 \times 10^{15}/cm^2$.

Figure 8C:
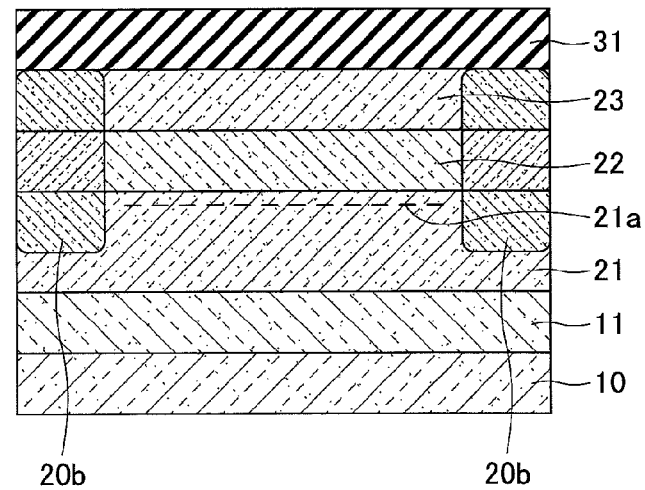

Next, as illustrated in FIG. 8C, a heat-protective film 31 is formed of SiN with the thickness of about 200 nm on the upper surface layer 23. The heat-protective film 31 is formed by CVD (Chemical Vapor Deposition), and has an amorphous state.

Figure 9A:
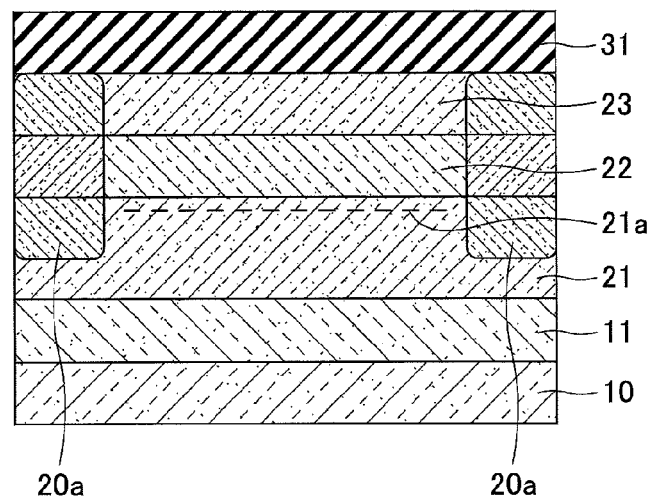
FIGS. 9A-9C are second process views illustrating the manufacturing method of the semiconductor device according to the second embodiment.

Next, as illustrated in FIG. 9A, Si-activation annealing is performed. Specifically, RTA is performed to heat it for one minute at a temperature about 1100° C. This activates Si doped in the regions 20b, and the regions 20b become the n-type regions 20a.

Figure 9B:
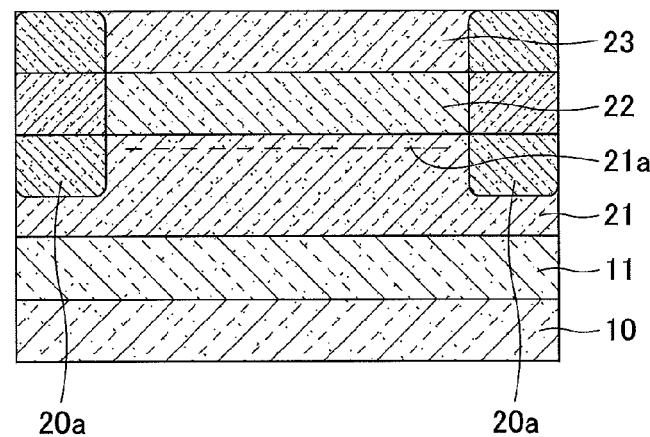

Next, as illustrated in FIG. 9B, the heat-protective film 31 is removed by using a solvent that includes hydrofluoric acid.

Figure 9C:
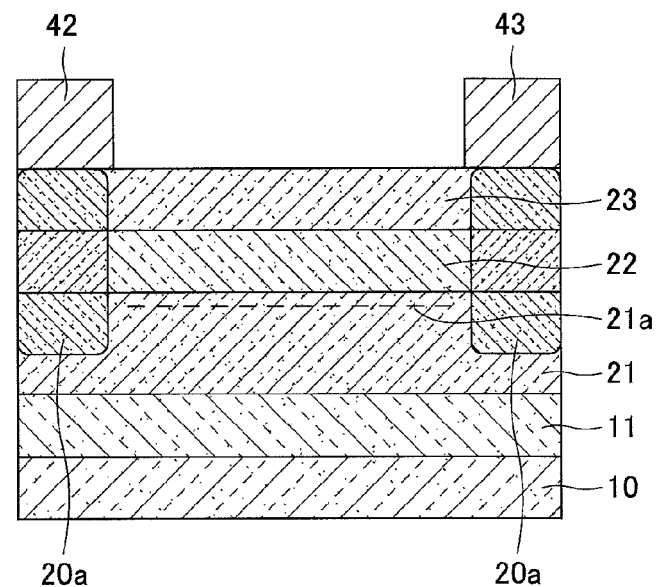

Next, as illustrated in FIG. 9C, the source electrode 42, and the drain electrode 43 are formed on the upper surface layer 23. Note that the source electrode 42 and the drain electrode 43 are formed on the n-type regions 20a in the upper surface layer 23.

Figure 10A:
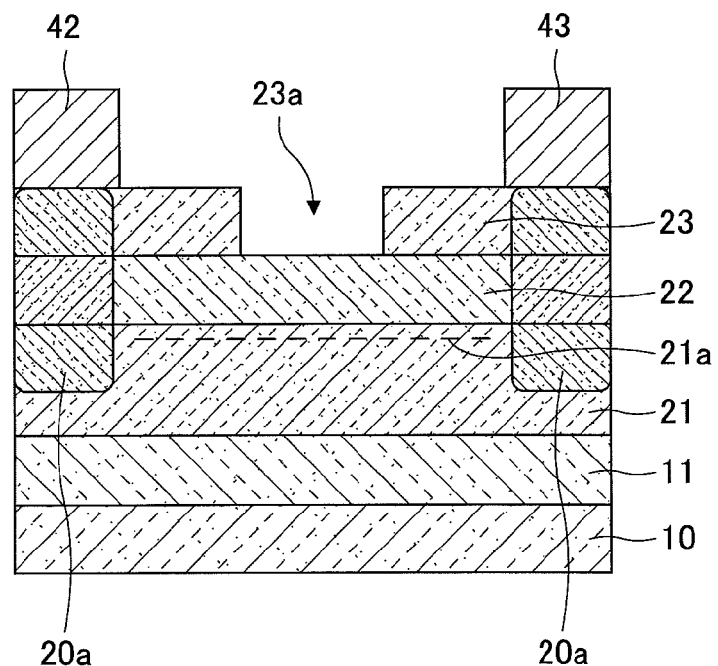
FIGS. 10A-10B are third process views illustrating the manufacturing method of the semiconductor device according to the second embodiment.

Next, as illustrated in FIG. 10A, an opening 23a is formed by removing the upper surface layer 23 in a region where a gate electrode 41 is to be formed, and exposing the surface of the electron supply layer 22. Specifically, by applying photoresist on the upper surface layer 23, which is then exposed by an exposure device and developed, a photoresist pattern (not illustrated) is formed that has an opening in the region where the opening 23a is to be formed. After that, the opening 23a is formed by removing the upper surface layer 23 in the region where the photoresist pattern is not formed, by dry etching that uses a chlorine-based gas, and exposing the electron supply layer 22. After that, the photoresist pattern (not illustrated) is removed by an organic solvent or the like.

Figure 10B:
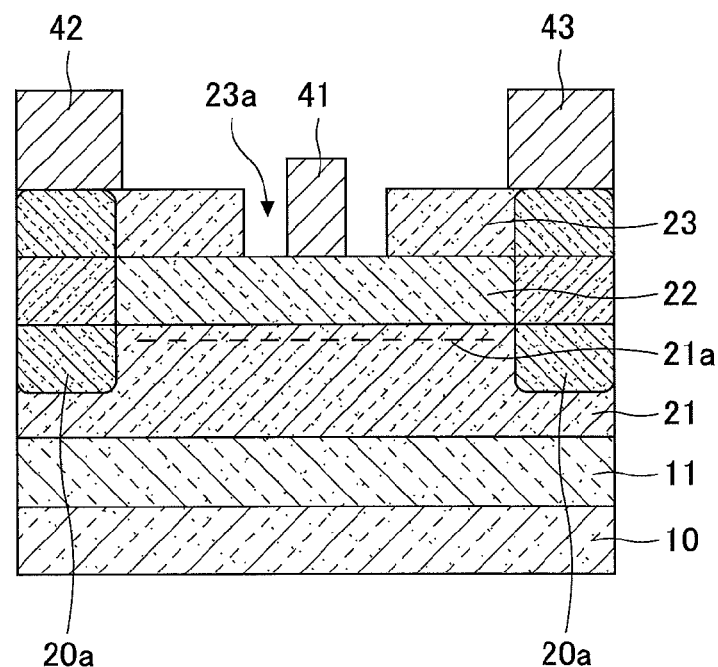

Next, as illustrated in FIG. 10B, the gate electrode 41 is formed on the electron supply layer at the opening 23a.

Thus, the semiconductor device can be manufactured according to the present embodiment.

Note that the content other than described above is substantially the same as in the first embodiment.

Third Embodiment

Next, a third embodiment will be described.

(Semiconductor Device)

Figure 11:
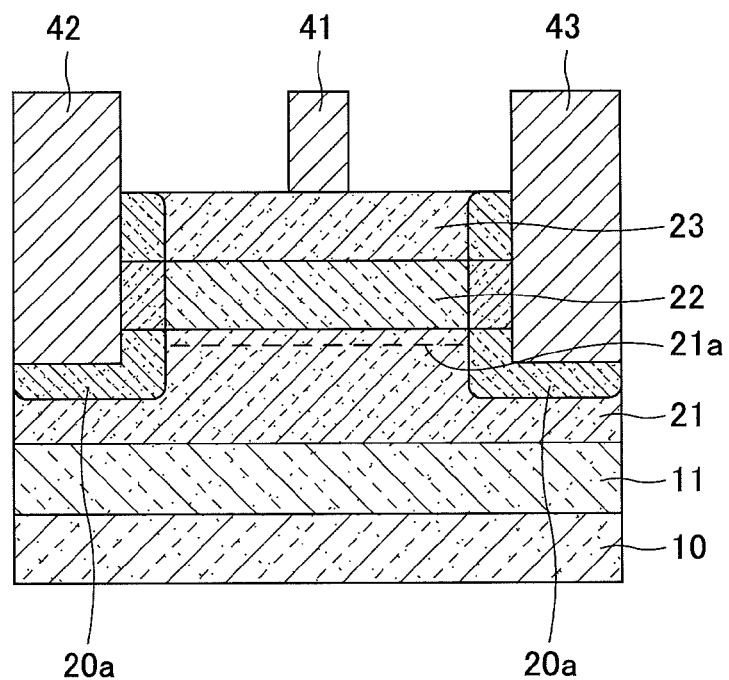
FIG. 11 is a structural view of a semiconductor device according to a third embodiment.

A semiconductor device will be described according to the present invention based on FIG. 11. The semiconductor device in the present embodiment has layers formed on a substrate 10 made of SiC or the like where the layers include a buffer layer 11 formed of AlN and the like, an electron transit layer formed of i-GaN, an electron supply layer 22 formed of InAlN, and an upper surface layer 23 formed of AlGaN, which are stacked in this order. With this structure, 2 DEG 21a is generated in the neighborhood of the interface between the electron transit layer and the electron supply layer 22 in the electron transit layer 21.

The substrate 10 may be formed of a material other than SiC such as Si. Also, the electron transit layer 21 is formed to have the thickness of about 2 µm, the electron supply layer 22 is formed of $In_{0.17}Al_{0.83}N$ having the thickness of about 10 nm, and the upper surface layer 23 is formed of $Al_{0.2}Ga_{0.8}N$ having the thickness of about 10 nm.

A gate electrode 41 is formed on the upper surface layer 23. Also, a part of the upper surface layer 23, the electron supply layer 22, and the electron transit layer 21 are removed in regions where a source electrode 42 and a drain electrode 43 are formed. Thus, in the present embodiment, the source electrode 42 and the drain electrode 43 are formed contacting the electron transit layer 21. Also, n-type regions 20a are formed by applying ion implantation with an impurity element such as Si to the upper surface layer 23, the electron supply layer 22, and the electron transit layer 21 in neighboring regions where the source electrode 42 and the drain electrode 43 are formed. This makes it possible to further lower the contact resistance because the electron transit layer 21 directly contacts the source electrode 42 and the drain electrode 43.

(Manufacturing Method of Semiconductor Device)

Next, a manufacturing method of the semiconductor device in the present embodiment will be described based on FIGS. 12A-14B.

Figure 12A:
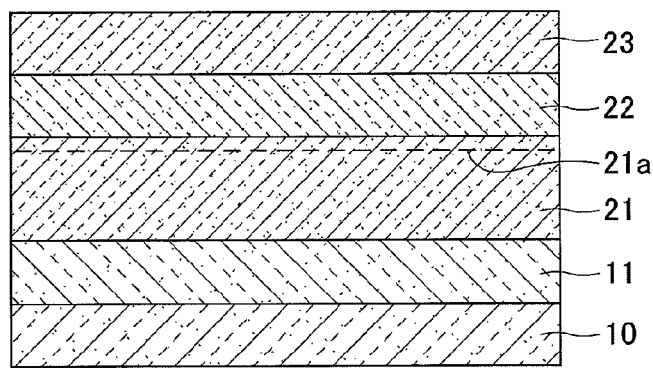
FIGS. 12A-12C are first process views illustrating a manufacturing method of a semiconductor device according to the third embodiment.

First, as illustrated in FIG. 12A, layers are formed on a substrate 10 made of SiC or the like that include a buffer layer 11, an electron transit layer 21, an electron supply layer 22, and an upper surface layer 23 by epitaxial growth using MOCVD. The buffer layer 11 is formed of a material including AlN and the like, and the electron transit layer 21 is formed of GaN, both at a substrate temperature of about 1000° C. The electron supply layer 22 is formed of InAlN, for example, $In_{0.17}Al_{0.83}N$ at a substrate temperature of about 500 to 800° C. The upper surface layer 23 is formed of AlGaN, for example, Al0.2Ga0.8N at a substrate temperature of about 800° C.

Figure 12B:
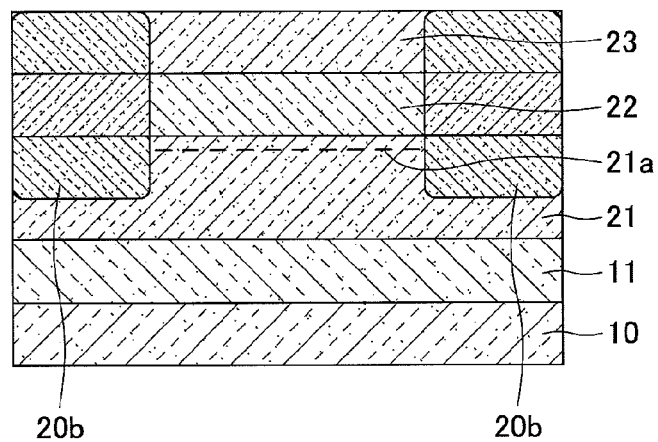

Next, as illustrated in FIG. 12B, ion implantation is applied with an impurity element such as Si to the upper surface layer 23, the electron supply layer 22, and the electron transit layer 21 in regions 20b in which a source electrode 42 and a drain electrode 43 are to be formed, and the regions 20b are to be formed as n-type regions 20a. Specifically, ion implantation is applied to the regions 20b where the n-type regions 20a are to be formed in the upper surface layer 23, the electron supply layer 22, and the electron transit layer 21, with the impurity element such as Si to have the density of about $1 \times 10^{20}/\text{cm}^3$. For example, when performing Si ion implantation, Si ions are implanted at an acceleration voltage of 40 keV and a dose of $1 \times 10^{15}/\text{cm}^2$.

Figure 12C:
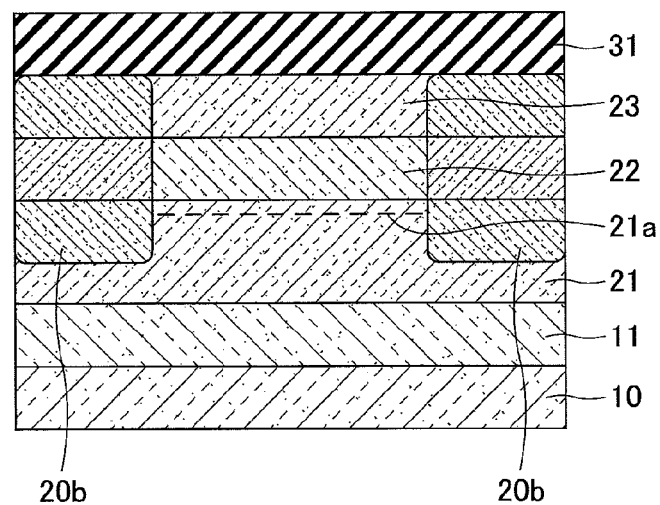

Next, as illustrated in FIG. 12C, a heat-protective film 31 is formed of SiN with the thickness of about 200 nm on the upper surface layer 23. The heat-protective film 31 is formed by CVD (Chemical Vapor Deposition), and has an amorphous state.

Figure 13A:
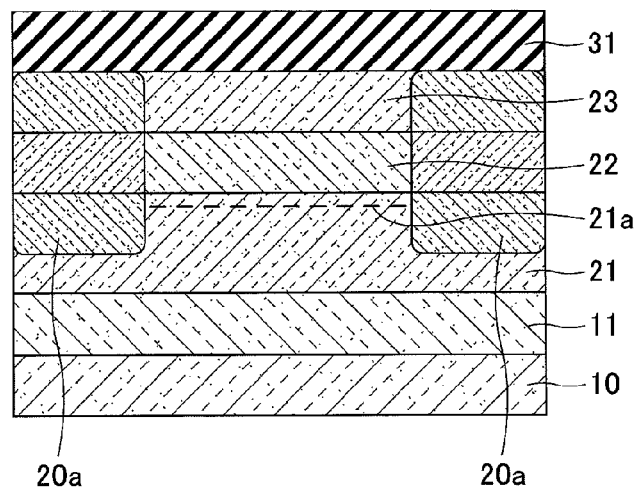
FIGS. 13A-13C are second process views illustrating the manufacturing method of the semiconductor device according to the third embodiment.

Next, as illustrated in FIG. 13A, Si-activation annealing is performed. Specifically, RTA is performed to heat it for one minute at a temperature about 1100° C. This activates Si doped in the regions 20b, and the regions 20b become the n-type regions 20a.

Figure 13B:
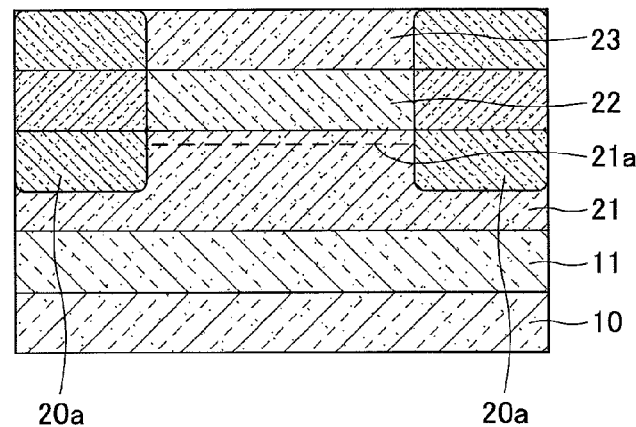

Next, as illustrated in FIG. 13B, the heat-protective film 31 is removed by using a solvent that includes hydrofluoric acid.

Figure 13C:
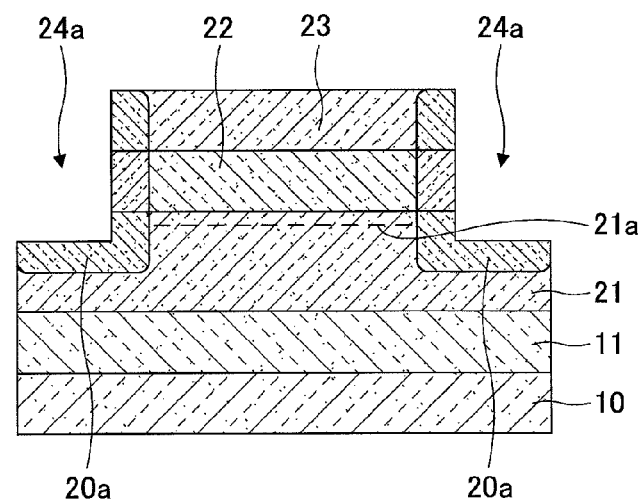

Next, as illustrated in FIG. 13C, openings 24a are formed by removing a part of the upper surface layer 23, the electron supply layer 22, and the electron transit layer 21 in regions where the source electrode 42 and the drain electrode 43 are to be formed. Specifically, by applying photoresist on the upper surface layer 23, which is then exposed by an exposure device and developed, a photoresist pattern (not illustrated) is formed that has openings in the regions where the openings 24a are to be formed. After that, the openings 24a are formed by removing the part of the upper surface layer 23, the electron supply layer 22, and the electron transit layer 21 in the regions where the photoresist pattern is not formed, by dry etching that uses a chlorine-based gas, and exposing the electron transit layer 21. After that, the photoresist pattern (not illustrated) is removed by an organic solvent or the like.

Figure 14A:
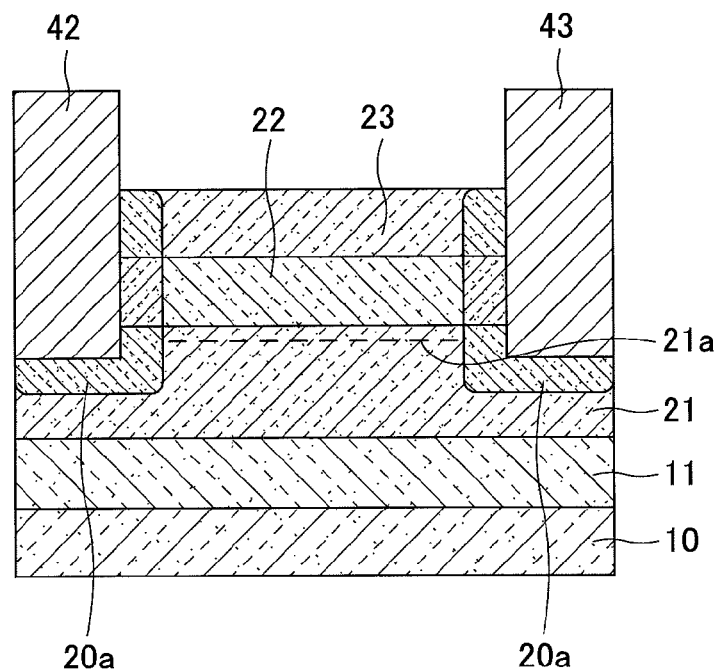
FIGS. 14A-14B are third process views illustrating the manufacturing method of the semiconductor device according to the third embodiment.

Next, as illustrated in FIG. 14A, the source electrode 42 and the drain electrode 43 are formed at the openings 24a.

Figure 14B:
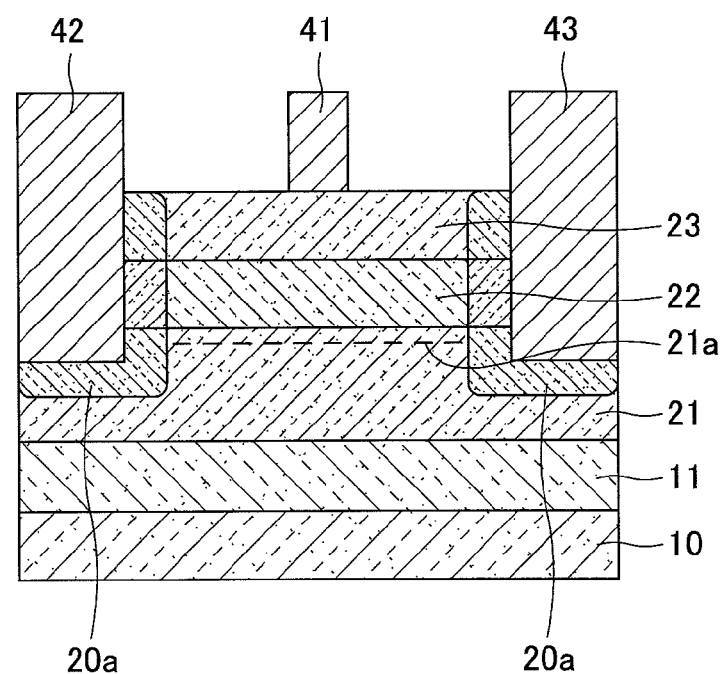

Next, as illustrated in FIG. 14B, a gate electrode 41 is formed at a predetermined region on the upper surface layer 23. Thus, the semiconductor device can be manufactured according to the present embodiment.

Note that the content other than described above is substantially the same as in the first embodiment.

Fourth Embodiment

Next, a fourth embodiment will be described.
(Semiconductor Device)

Figure 15:
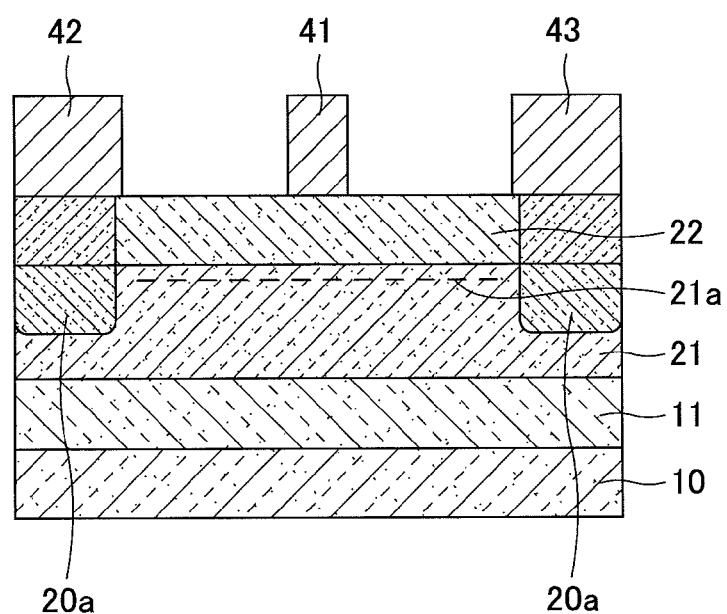
FIG. 15 is a structural view of a semiconductor device according to a fourth embodiment.

Next, a semiconductor device will be described according to the present invention based on FIG. 15. The semiconductor device in the present embodiment has layers formed on a substrate 10 made of SiC or the like where the layers include a buffer layer 11 formed of AlN and the like, an electron transit layer 21 formed of i-GaN, an electron supply layer 22 formed of InAlN, which are stacked in this order. With this structure, 2 DEG 21a is generated in the neighborhood of the interface between the electron transit layer 21 and the electron supply layer 22 in the electron transit layer 21.

The substrate 10 may be formed of a material other than SiC such as Si. Also, the electron transit layer 21 is formed to have the thickness of about 2 μm, and the electron supply layer 22 is formed of $\text{In}_{0.17}\text{Al}_{0.83}\text{N}$ having the thickness of about 10 nm.

A gate electrode 41, a source electrode 42, and a drain electrode 43 are formed on the electron supply layer 22. Also, n-type regions 20a are formed by applying ion implantation with an impurity element such as Si to the electron supply layer 22 and the electron transit layer 21 at regions where the source electrode 42 and the drain electrode 43 are formed. This makes it possible to lower the contact resistance with the source electrode 42 and the drain electrode 43.

(Manufacturing Method of Semiconductor Device)

Next, a manufacturing method of the semiconductor device in the present embodiment will be described based on FIGS. 16A-17C.

Figure 16A:
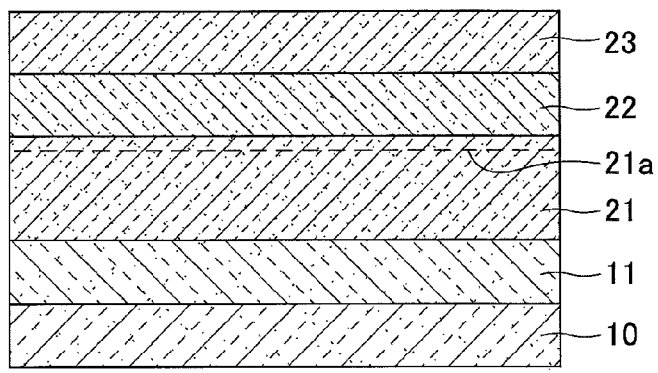
FIGS. 16A-16C are first process views illustrating a manufacturing method of a semiconductor device according to the fourth embodiment.

First, as illustrated in FIG. 16A, layers are formed on a substrate 10 made of SiC or the like that include a buffer layer 11, an electron transit layer 21, an electron supply layer 22, and an upper surface layer 23 by epitaxial growth using MOCVD. The buffer layer 11 is formed of a material including AlN and the like, and the electron transit layer 21 is formed of GaN, both at a substrate temperature of about 1000° C. The electron supply layer 22 is formed of InAlN, for example, $\text{In}_{0.17}\text{Al}_{0.83}\text{N}$ at a substrate temperature of about 500 to 800° C. The upper surface layer 23 is formed of AlGaN, for example, Al0.2Ga0.8N at a substrate temperature of about 800° C.

Figure 16B:
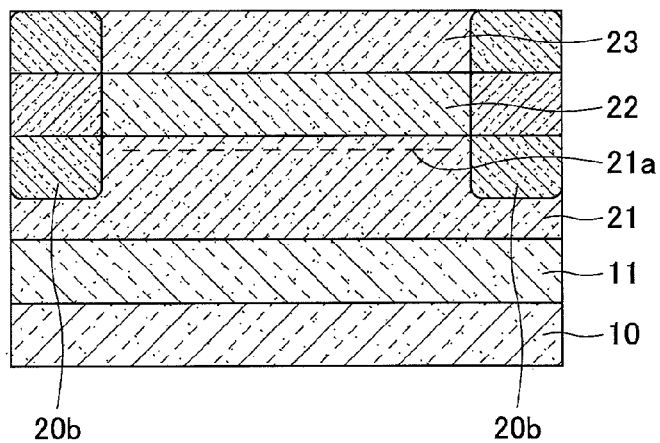

Next, as illustrated in FIG. 16B, ion implantation is applied with an impurity element such as Si to the upper surface layer 23, the electron supply layer 22, and the electron transit layer 21 in regions 20b located immediately below regions where a source electrode 42 and a drain electrode 43 are to be formed, and the regions 20b are to be formed as n-type regions 20a. Specifically, ion implantation is applied to the regions 20b where the n-type regions 20a are to be formed in the upper surface layer 23, the electron supply layer 22, and the electron transit layer 21, with the impurity element such as Si to have the density of about $1 \times 10^{20}/\text{cm}^3$. For example, when performing Si ion implantation, Si ions are implanted at an acceleration voltage of 40 keV and a dose of $1 \times 10^{15}/\text{cm}^2$.

Figure 16C:
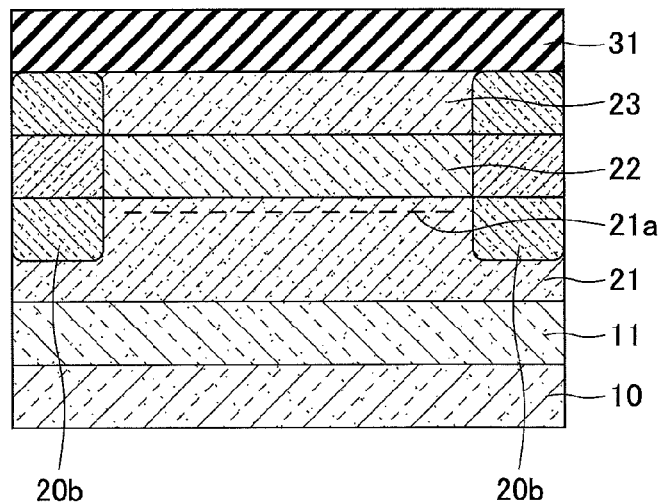

Next, as illustrated in FIG. 16C, a heat-protective film 31 is formed of SiN with the thickness of about 200 nm on the upper surface layer 23. The heat-protective film 31 is formed by CVD (Chemical Vapor Deposition), and has an amorphous state.

Figure 17A:
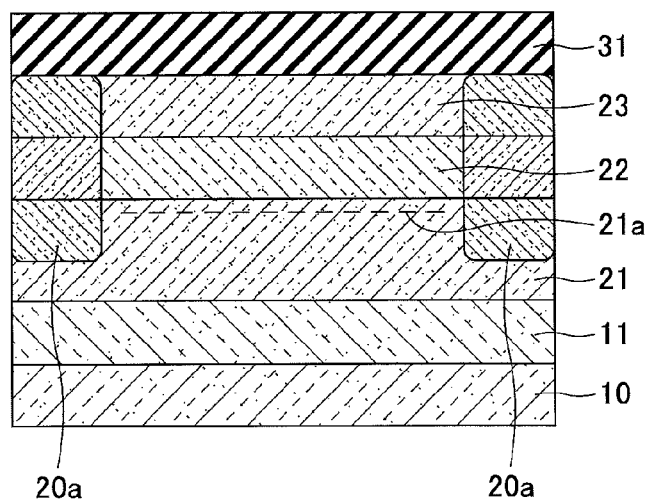
FIGS. 17A-17C are second process views illustrating the manufacturing method of the semiconductor device according to the fourth embodiment.

Next, as illustrated in FIG. 17A, Si-activation annealing is performed. Specifically, RTA is performed to heat it for one minute at a temperature about 1100° C. This activates Si doped in the regions 20b, and the regions 20b become the n-type regions 20a.

Figure 17B:
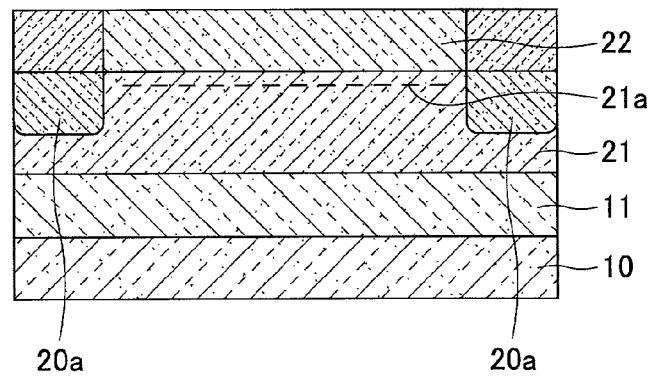

Next, as illustrated in FIG. 17B, the heat-protective film 31 is removed by using a solvent that includes hydrofluoric acid, and then, the upper surface layer 23 is removed by dry etching or wet etching to expose the surface of the electron supply layer 22.

Figure 17C:
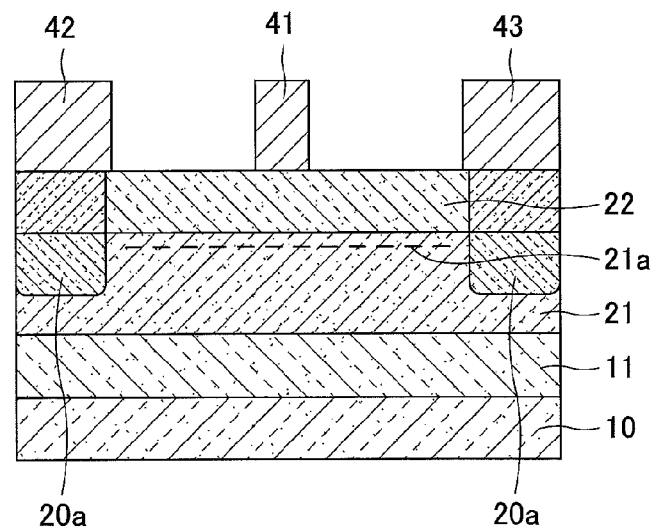

Next, as illustrated in FIG. 17C, a gate electrode 41, the source electrode 42, and the drain electrode 43 are formed on the electron supply layer 22. Note that the source electrode 42 and the drain electrode 43 are formed on the n-type regions 20a in the electron supply layer 22. Thus, the semiconductor device can be manufactured according to the present embodiment.

Note that although a case is described where the heat-protective film 31 is formed in the present embodiment, substantially the same semiconductor device can be manufactured without forming a heat-protective film 31. This is because the upper surface layer 23 formed on the electron supply layer 22 is a crystal film, with which the surface of the electron supply layer 22 does not become rough even if a heat-protective film 31 is not formed. Note that the content other than described above is substantially the same as in the first embodiment.

Fifth Embodiment

Next, a fifth embodiment will be described.

(Semiconductor Device)

Figure 18:
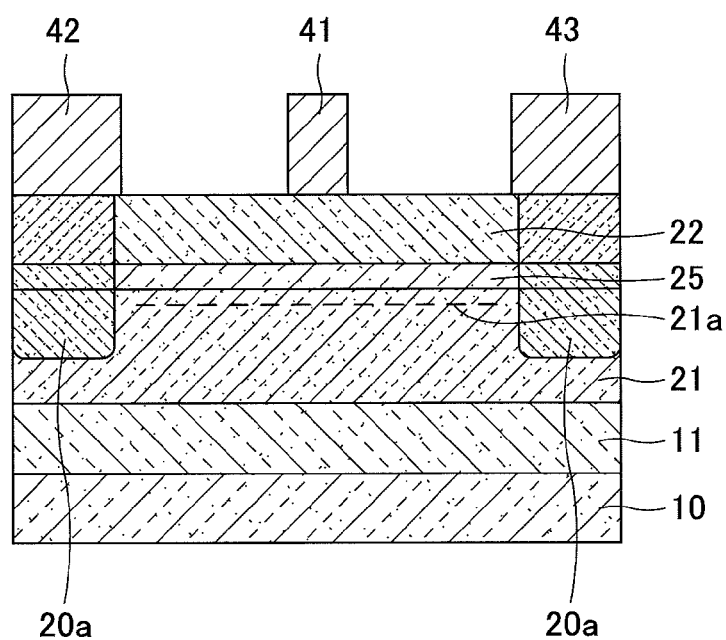
FIG. 18 is a structural view of a semiconductor device according to a fifth embodiment.

Next, a semiconductor device will be described according to the present invention based on FIG. 18. The semiconductor device in the present embodiment has layers formed on a substrate 10 made of SiC or the like where the layers include a buffer layer 11 formed of AlN and the like, an electron transit layer 21 formed of i-GaN, an intermediate layer 25 formed of AlN, and an electron supply layer formed of InAlN, which are stacked in this order. With this structure, 2 DEG 21a is generated in the neighborhood of the interface between the electron transit layer 21 and the electron supply layer 22 in the electron transit layer 21.

The substrate 10 may be formed of a material other than SiC such as Si. Also, the electron transit layer 21 is formed to have the thickness of about 2 μm, and the electron supply layer 22 is formed of $In_{0.17}Al_{0.83}N$ having the thickness of about 10 nm. Also, the intermediate layer 25 has the thickness of about 1 nm.

A gate electrode 41, a source electrode 42, and a drain electrode 43 are formed on the electron supply layer 22. Also, n-type regions 20a are formed by applying ion implantation with an impurity element such as Si to the electron supply layer 22 and the electron transit layer 21 at regions where the source electrode 42 and the drain electrode 43 are formed. This makes it possible to lower the contact resistance with the source electrode 42 and the drain electrode 43.

(Manufacturing Method of Semiconductor Device)

Next, a manufacturing method of the semiconductor device in the present embodiment will be described based on FIGS. 19A-20C.

Figure 19A:
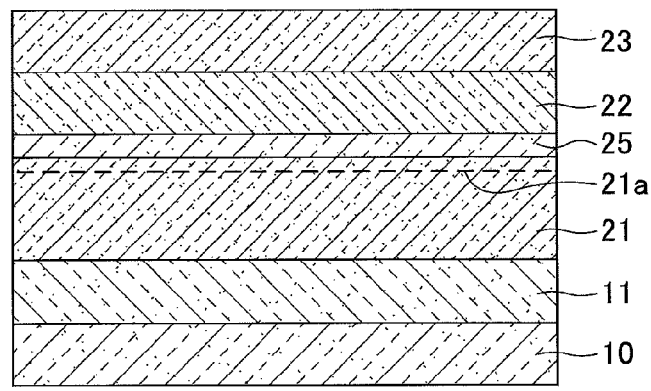
FIGS. 19A-19C are first process views illustrating a manufacturing method of a semiconductor device according to the fifth embodiment.

First, as illustrated in FIG. 19A, layers are formed on a substrate 10 made of SiC or the like that include a buffer layer 11, an electron transit layer 21, an intermediate layer 25, an electron supply layer 22, and the upper surface layer 23 by epitaxial growth using MOCVD. The buffer layer 11 is formed of a material including AlN and the like, the electron transit layer 21 is formed of GaN, and the intermediate layer 25 is formed of AlN, all at a substrate temperature of about 1000° C. The electron supply layer 22 is formed of InAlN, for example, $In_{0.17}Al_{0.83}N$ at a substrate temperature of about 500 to 800° C. The upper surface layer 23 is formed of AlGaN, for example, Al0.2Ga0.8N at a substrate temperature of about 800° C.

Figure 19B:
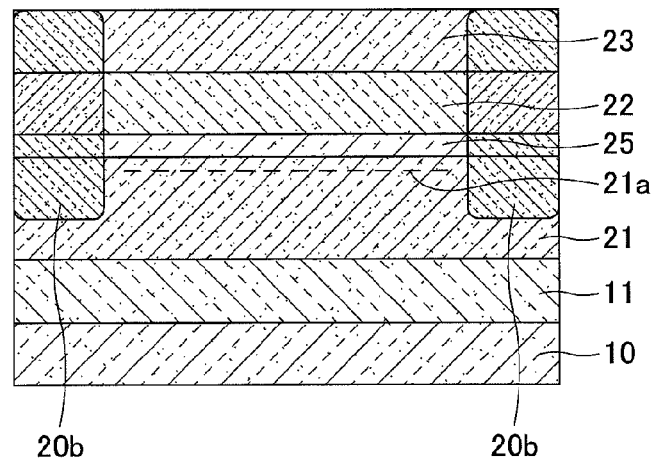

Next, as illustrated in FIG. 19B, ion implantation is applied with an impurity element such as Si to regions 20b where n-type regions 20a are to be formed in the upper surface layer 23, the electron supply layer 22, the intermediate layer 25, and the electron transit layer 21 immediately below regions where a source electrode 42 and a drain electrode 43 are to be formed. Specifically, ion implantation is applied to the regions 20b where the n-type regions 20a are to be formed in the upper surface layer 23, the electron supply layer 22, the intermediate layer 25, and the electron transit layer 21, with the impurity element such as Si to have the density of about $1 \times 10^{20}/cm^3$. For example, when performing Si ion implantation, Si ions are implanted at an acceleration voltage of 40 keV and a dose of $1 \times 10^{15}/cm^2$.

Figure 19C:
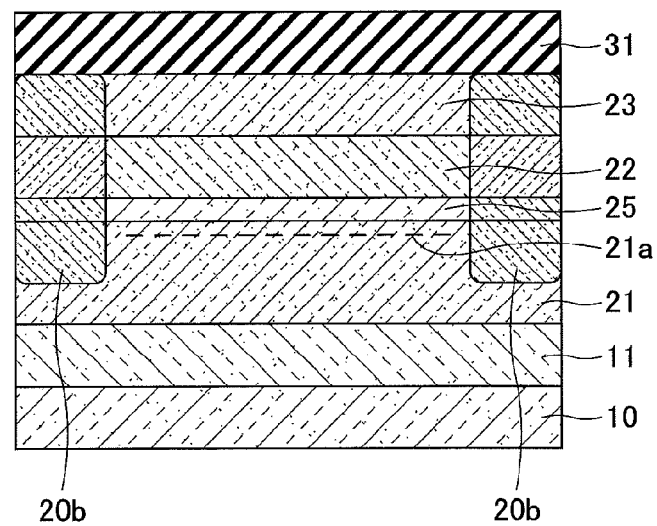

Next, as illustrated in FIG. 19C, a heat-protective film 31 is formed of SiN with the thickness of about 200 nm on the upper surface layer 23. The heat-protective film 31 is formed by CVD (Chemical Vapor Deposition), and has an amorphous state.

Figure 20A:
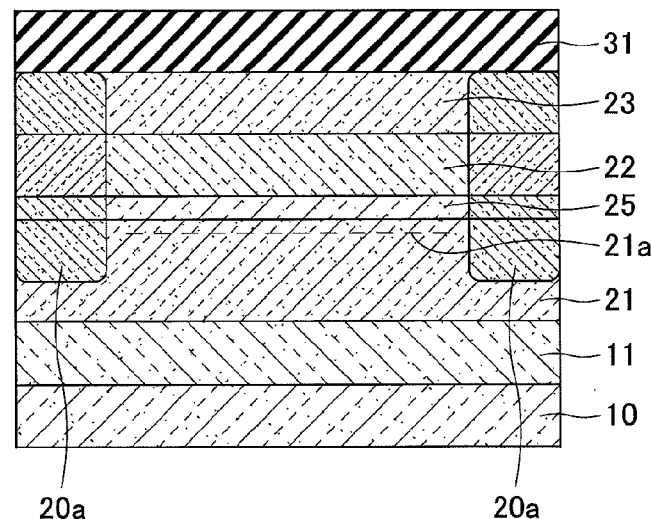
FIGS. 20A-20C are second process views illustrating the manufacturing method of the semiconductor device according to the fifth embodiment.

Next, as illustrated in FIG. 20A, Si-activation annealing is performed. Specifically, RTA is performed to heat it for one minute at a temperature about 1100° C. This activates Si doped in the regions 20b, and the regions 20b become the n-type regions 20a.

Figure 20B:
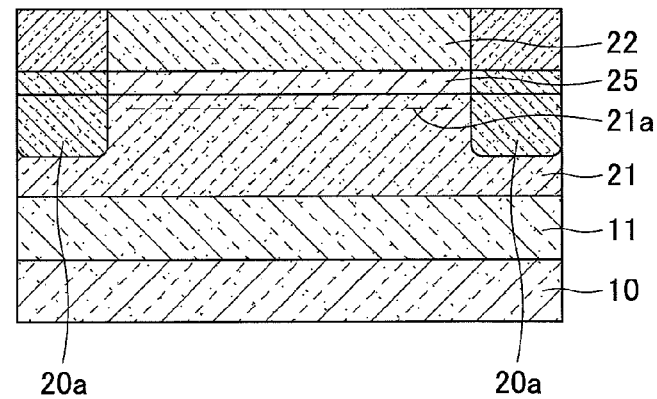

Next, as illustrated in FIG. 20B, the heat-protective film 31 is removed by using a solvent that includes hydrofluoric acid, and then, the upper surface layer 23 is removed by dry etching or wet etching to expose the surface of the electron supply layer 22.

Figure 20C:
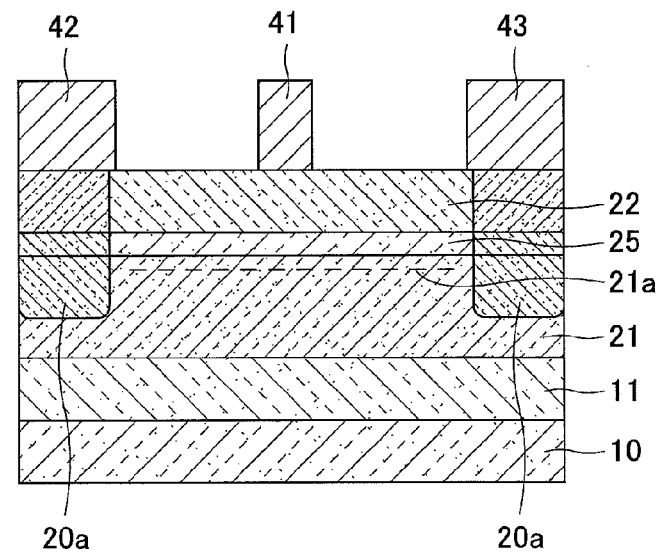

Next, as illustrated in FIG. 20C, a gate electrode 41, the source electrode 42, and the drain electrode 43 are formed on the electron supply layer 22. Note that the source electrode 42 and the drain electrode 43 are formed on the n-type regions 20a in the electron supply layer 22. Thus, the semiconductor device can be manufactured according to the present embodiment.

Note that the content other than described above is substantially the same as in the fourth embodiment. Also, the structure having an intermediate layer 25 as in the present embodiment may be applied to the semiconductor devices in the first to third embodiments.

Sixth Embodiment

Next, a sixth embodiment will be described.

(Semiconductor Device)

Figure 21:
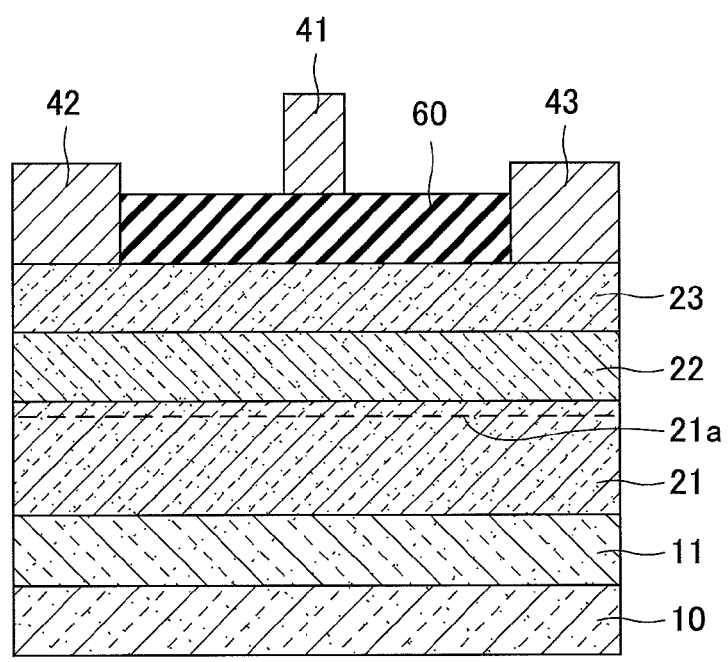
FIG. 21 is a structural view of a semiconductor device according to a sixth embodiment.

Next, a semiconductor device will be described according to the present invention based on FIG. 21. The semiconductor device in the present embodiment has a structure in which an insulation film 60 is formed under a gate electrode 41, instead of a structure in which n-type regions 20a are formed in a nitride semiconductor layer contacting a source electrode 42 and a drain electrode 43. In such a semiconductor device having the insulation film 60 formed, characteristics of the semiconductor device can be improved, for example, by heating it at a high temperature of 800° C. or the like after forming the insulation film 60.

Specifically, the semiconductor device in the present embodiment has layers formed on a substrate 10 made of SiC or the like where the layers include a buffer layer 11 formed of AlN and the like, an electron transit layer 21 formed of i-GaN, and an electron supply layer 22 formed of InAlN, and an upper surface layer 23 formed of AlGaN which are stacked in this order. With this structure, 2 DEG 21a is generated in the neighborhood of the interface between the electron transit layer 21 and the electron supply layer 22 in the electron transit layer 21.

The substrate 10 may be formed of a material other than SiC such as Si. Also, the electron transit layer 21 is formed to have the thickness of about 2 μm, the electron supply layer 22 is formed of $In_{0.17}Al_{0.83}N$ having the thickness of about nm, and the upper surface layer 23 is formed of $Al_{0.2}Ga_{0.8}N$ having the thickness of about 10 nm.

The source electrode 42 and the drain electrode 43 are formed on the upper surface layer 23. Also, the insulation film 60 is formed in a region on the upper surface layer 23 where the source electrode 42 and the drain electrode 43 are not formed, and the gate electrode 41 is formed in a predetermined region on the insulation film 60. In the present embodiment, the insulation film 60 is formed of aluminum oxide (Al2O3) to have the thickness of about 40 nm.

(Manufacturing Method of Semiconductor Device)

Next, a manufacturing method of the semiconductor device in the present embodiment will be described based on FIGS. 22A-23B.

Figure 22A:
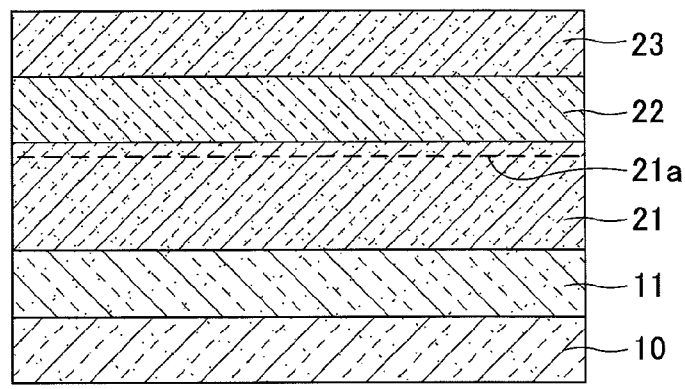
FIGS. 22A-22C are first process views illustrating a manufacturing method of a semiconductor device according to the sixth embodiment.

First, as illustrated in FIG. 22A, layers are formed on a substrate 10 made of SiC or the like that include a buffer layer 11, an electron transit layer 21, an electron supply layer 22, and an upper surface layer 23 by epitaxial growth using MOCVD. The buffer layer 11 is formed of a material including AlN and the like, and the electron transit layer 21 is formed of GaN, both at a substrate temperature of about 1000° C. The electron supply layer 22 is formed of InAlN, for example, $In_{0.17}Al_{0.83}N$ at a substrate temperature of about 500 to 800° C. The upper surface layer 23 is formed of AlGaN, for example, Al0.2Ga0.8N at a substrate temperature of about 800° C.

Figure 22B:
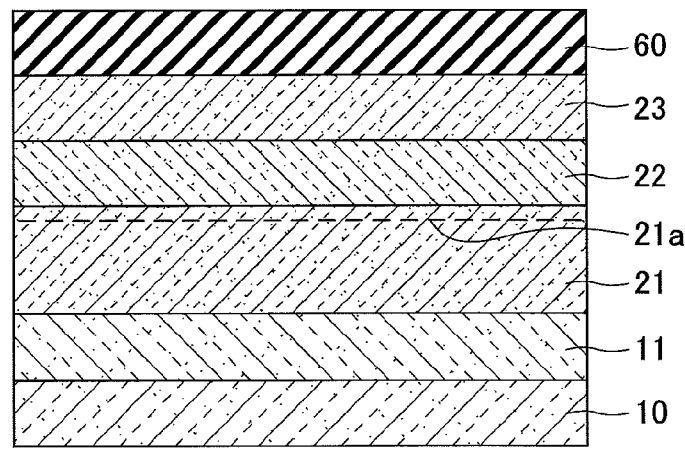

Next, as illustrated in FIG. 22B, an insulation film 60 is formed on the upper surface layer 23. Specifically, a film of aluminum oxide (Al2O3) having the thickness of about 40 nm is formed by ALD (Atomic Layer Deposition) on the upper surface layer 23, to form the insulation film 60. Note that after forming the insulation film 60, it is heated for one minute at a temperature of about 800° C. in nitrogen atmosphere by RTA, with which characteristics of the manufactured semiconductor device can be improved.

Figure 22C:
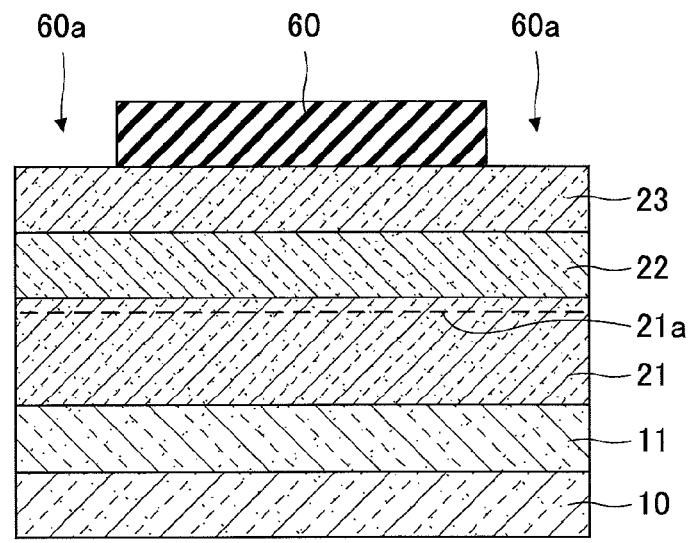

Next, as illustrated in FIG. 22C, openings 60a are formed by removing the insulation film 60 in regions where a source electrode 42 and a drain electrode 43 are to be formed. Specifically, by applying photoresist on the insulation film 60, which is then exposed by an exposure device and developed, a photoresist pattern (not illustrated) is formed that has openings in the regions where the source electrode 42 and the drain electrode 43 are to be formed. After that, the openings 60a are formed by removing the insulation film 60 in the regions where the photoresist pattern is not formed, by dry etching that uses a chlorine-based gas, and exposing the surface of the upper surface layer 23. After that, the photoresist pattern (not illustrated) is removed by an organic solvent or the like.

Figure 23A:
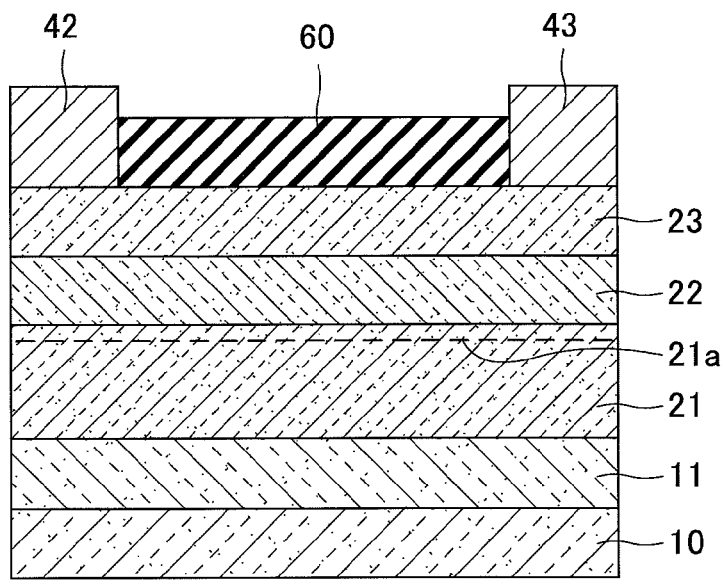
FIGS. 23A-23B are second process views illustrating the manufacturing method of the semiconductor device according to the sixth embodiment.

Next, as illustrated in FIG. 23A, the source electrode 42 and the drain electrode 43 are formed on the exposed upper surface layer 23 at the openings 60a of the insulation film 60.

Figure 23B:
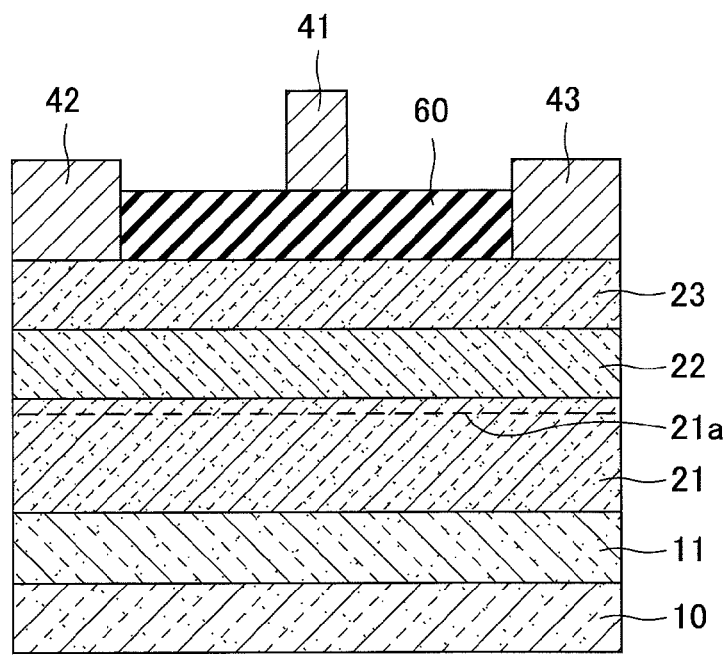

Next, as illustrated in FIG. 23B, a gate electrode 41 is formed on the insulation film 60. Thus, the semiconductor device can be manufactured according to the present embodiment.

In the semiconductor device in the present embodiment, a smaller number of trap levels are formed in the insulation film 60 or the like, with which stable operation can be realized.

Seventh Embodiment

Next, a seventh embodiment will be described. The present embodiment relates to a semiconductor device, a power source device, and a high-frequency amplifier.

Figure 24:
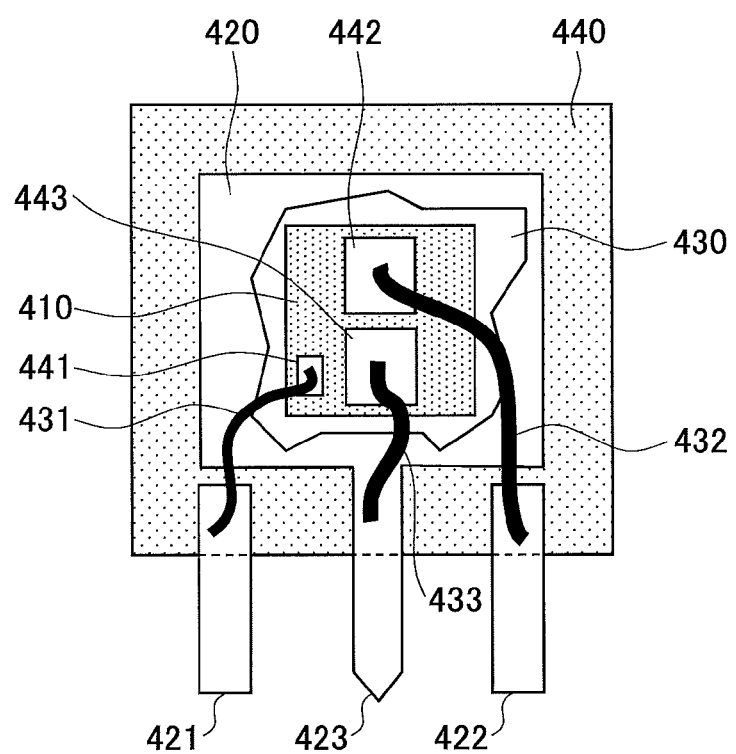
FIG. 24 is a schematic view of a semiconductor device in a discrete package according to a seventh embodiment.

The semiconductor device in the present embodiment includes a semiconductor device according to any of the first to sixth embodiments, which is contained in a discrete package, which will be described based on FIG. 24. Note that FIG. 24 schematically illustrates the inside of the discretely packaged semiconductor device in which positions of the electrodes and the like may be different from those in the first to sixth embodiments.

First, a semiconductor device manufactured according to any of the first to sixth embodiments is cut off by dicing or the like to form a semiconductor chip 410, which is a HEMT made of GaN semiconductor materials. The semiconductor chip 410 is fixed on a lead frame 420 by a die attachment agent 430 such as solder.

Next, a gate electrode 441 is connected with a gate lead 421 by a bonding wire 431, a source electrode 442 is connected with a source lead 422 by a bonding wire 432, and a drain electrode 443 is connected with a drain lead 423 by a bonding wire 433. Note that the bonding wires 431, 432, and 433 are formed of a metal material such as Al. Also, the gate electrode 441 is a gate electrode pad in the present embodiment, which is connected with the gate electrode 41 of the semiconductor device according to any of the first to sixth embodiments. Also, the source electrode 442 is a source electrode pad, which is connected with the source electrode 42, and the drain electrode 443 is a drain electrode pad, which is connected with the drain electrode 43.

Next, resin sealing is performed by a transfer molding method using a mold resin 440. Thus, the HEMT made of GaN semiconductor materials can be manufactured as the discretely packaged semiconductor device.

Also, the power source device and the high-frequency amplifier in the present embodiment use one or more of the semiconductor devices in the first to sixth embodiments, respectively.

Figure 25:
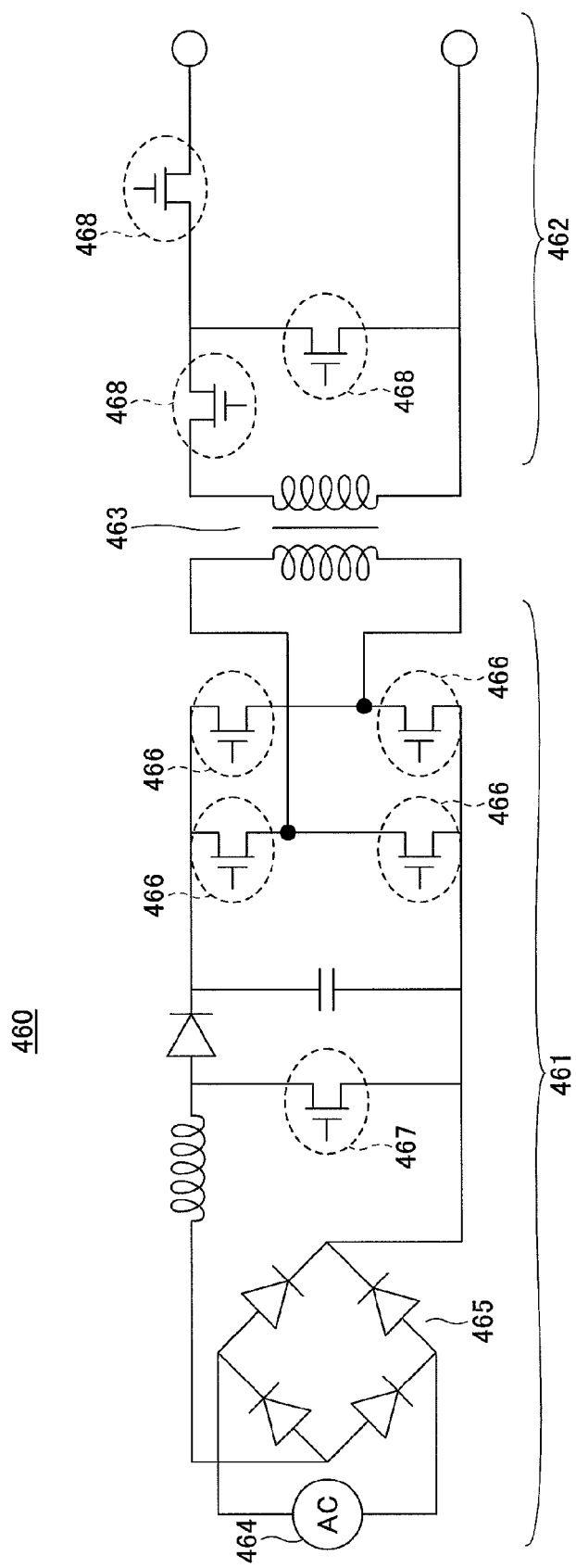
FIG. 25 is a circuit diagram of a power source device according to the seventh embodiment.

Based on FIG. 25, the power source device will be described according to the present embodiment. The power source device 460 in the present embodiment includes a high-voltage primary circuit 461, a low-voltage secondary circuit 462, and a transformer 463 disposed between the primary circuit 461 and the secondary circuit 462. The primary circuit 461 includes an AC power supply 464, a so-called "bridge rectifier circuit" 465, multiple (four in the example in FIG. 25) switching elements 466, and a switching element 467. The secondary circuit 462 includes multiple (three in the example in FIG. 25) switching elements 468. In the example in FIG. 25, semiconductor devices according to any of the first to sixth embodiments are used as the switching elements 466 and 467 in the primary circuit 461. Note that it is preferable that the switching elements 466 and 467 in the primary circuit 461 are normally-off semiconductor devices. Also, the switching elements 468 used in the secondary circuit 462 use usual MISFETs (metal insulator semiconductor field effect transistors) formed of silicon.

Figure 26:
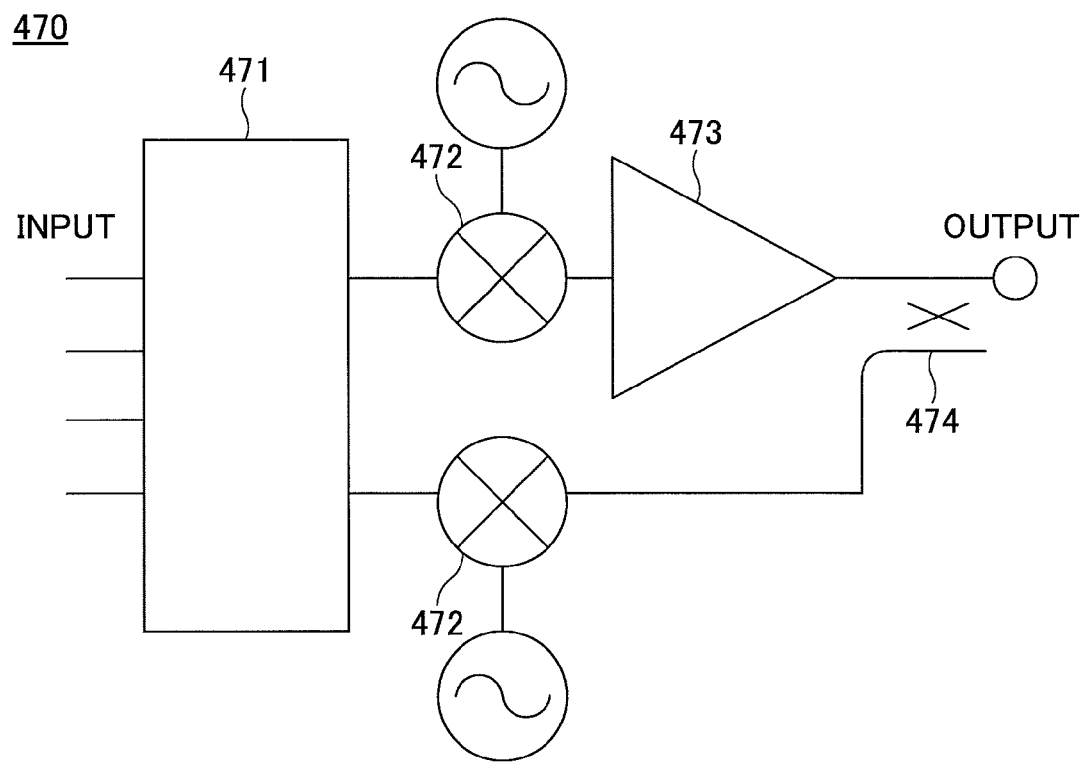
FIG. 26 is a circuit diagram of a high-output amplifier according to the seventh embodiment.

Also, based on FIG. 26, the high-frequency amplifier in the present embodiment will be described. The high frequency amplifier 470 in the present embodiment may be used for, for example, a power amplifier in a base station of cellular phones. This high-frequency amplifier 470 includes a digital predistortion circuit 471, mixers 472, a power amplifier 473, and a directional coupler 474. The digital predistortion circuit 471 compensates for non-linear distortion of an input signal. One of the mixers 472 mixes the input signal having non-linear distortion compensated for, with an alternating current signal. The power amplifier 473 amplifies the input signal having been mixed with the alternating current signal. In the example illustrated in FIG. 26, the power amplifier 473 includes a HEMT, or a semiconductor device according to any of the first to sixth embodiments. The directional coupler 474 monitors the input signal and an output signal. In the circuit illustrated in FIG. 26, by turning on/off a switch, for example, it is possible to mix the output signal with an alternating current signal by using the other mixer 472, and to transmit the mixed signal to the digital predistortion circuit 471.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A manufacturing method of the semiconductor device, the method further comprising:

forming an electron transit layer, an electron supply layer, and an upper surface layer in order on a substrate by epitaxial growth;

implanting ions of an impurity element of a first conductivity-type in regions immediately below where a source electrode and a drain electrode are to be formed in the electron supply layer and the upper surface layer;

forming a heat-protective film on the upper surface layer after the implanting the ions of the impurity element of the first conductivity-type; and applying heat to activate the implanted ions so that the regions with the implanted ions become first conductivity-type regions;

removing the heat-protective film and all of the upper surface layer;

forming the source electrode and the drain electrode on one of the electron supply layer, and the electron transit layer; and forming a gate electrode on the electron supply layer, wherein the electron supply layer is formed of a nitride semiconductor including In, wherein the upper surface layer is formed of a material including a nitride of one or more elements selected among B, Al, and Ga.

2. The manufacturing method of the semiconductor device as claimed in claim 1, wherein the impurity element of the first conductivity-type is Si, and the applying heat is performed at a temperature greater than or equal to 900° C. and less than or equal to 1500° C.

* * * * *